(12) United States Patent
You

(10) Patent No.: US 7,964,873 B2
(45) Date of Patent: Jun. 21, 2011

(54) THIN FILM TRANSISTOR ARRAY PANEL AND MANUFACTURING METHOD THEREOF

(75) Inventor: Chun-Gi You, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 100 days.

(21) Appl. No.: 10/986,672

(22) Filed: Nov. 12, 2004

(65) Prior Publication Data

US 2005/0101062 A1 May 12, 2005

(30) Foreign Application Priority Data

Nov. 12, 2003 (KR) .................. 10-2003-0079694

(51) Int. Cl.
*H01L 21/00* (2006.01)
*H01L 21/84* (2006.01)
*H01L 27/14* (2006.01)
*H01L 29/00* (2006.01)
*H01L 27/108* (2006.01)

(52) U.S. Cl. ............ 257/69; 257/72; 257/349; 257/350; 257/E21.413; 257/E29.278; 257/E27.111; 438/151; 438/154; 438/163

(58) Field of Classification Search .................. 438/163, 438/151, 154; 257/69, 72, 350, E21.413, 257/E29.78, E27.111

See application file for complete search history.

(56) References Cited

U.S. PATENT DOCUMENTS

| | | | | |
|---|---|---|---|---|
| 5,719,065 A | * | 2/1998 | Takemura et al. | 438/163 |
| 5,985,701 A | * | 11/1999 | Takei et al. | 438/154 |
| 6,072,193 A | * | 6/2000 | Ohnuma et al. | 257/57 |
| 6,087,236 A | * | 7/2000 | Chau et al. | 438/301 |
| 6,156,613 A | * | 12/2000 | Wu | 438/300 |
| 6,627,471 B2 | * | 9/2003 | Yang | 438/30 |
| 6,627,489 B1 | * | 9/2003 | Plais et al. | 438/199 |
| 6,746,905 B1 | | 6/2004 | Fukuda | |
| 2005/0023533 A1 | * | 2/2005 | Peng et al. | 257/72 |

FOREIGN PATENT DOCUMENTS

JP 40114947 A * 6/1989

(Continued)

OTHER PUBLICATIONS

U.S. Patent No. 6,746,905 (it is related to Korean Application for which no English Language translation is within our possession), Jun. 8, 2004.

English Abstract for Publication No. 1020000031174, Jun. 5, 2000.

(Continued)

*Primary Examiner* — Walter L Lindsay, Jr.
*Assistant Examiner* — Ron Pompey
(74) *Attorney, Agent, or Firm* — F. Chau & Associates, LLC

(57) ABSTRACT

A thin film transistor array panel is provided, which includes: a substrate; a first polysilicon member that is formed on the substrate and includes an intrinsic region, at least one first extrinsic region, and at least one second extrinsic region disposed between the intrinsic region and the at least one first extrinsic region and having an impurity concentration lower than the at least one first extrinsic region; a first insulator formed on the first polysilicon member and having an edge substantially coinciding with a boundary between the at least one first extrinsic region and the at least one second extrinsic region; and a first electrode formed on the first• insulator and having an edge substantially coinciding with a boundary between the intrinsic region and the at least one second extrinsic region.

20 Claims, 33 Drawing Sheets

FOREIGN PATENT DOCUMENTS

| | | |
|---|---|---|
| KR | 1019990076290 | 10/1999 |
| KR | 1020000031174 | 6/2000 |
| KR | 10-0343307 | 8/2002 |
| KR | 1020030033995 | 5/2003 |

OTHER PUBLICATIONS

English Abstract for Publication No. 1019990076290, Oct. 15, 1999.
English Abstract for Publication No. 1020030033995, May 1, 2003.

* cited by examiner

FIG. 11
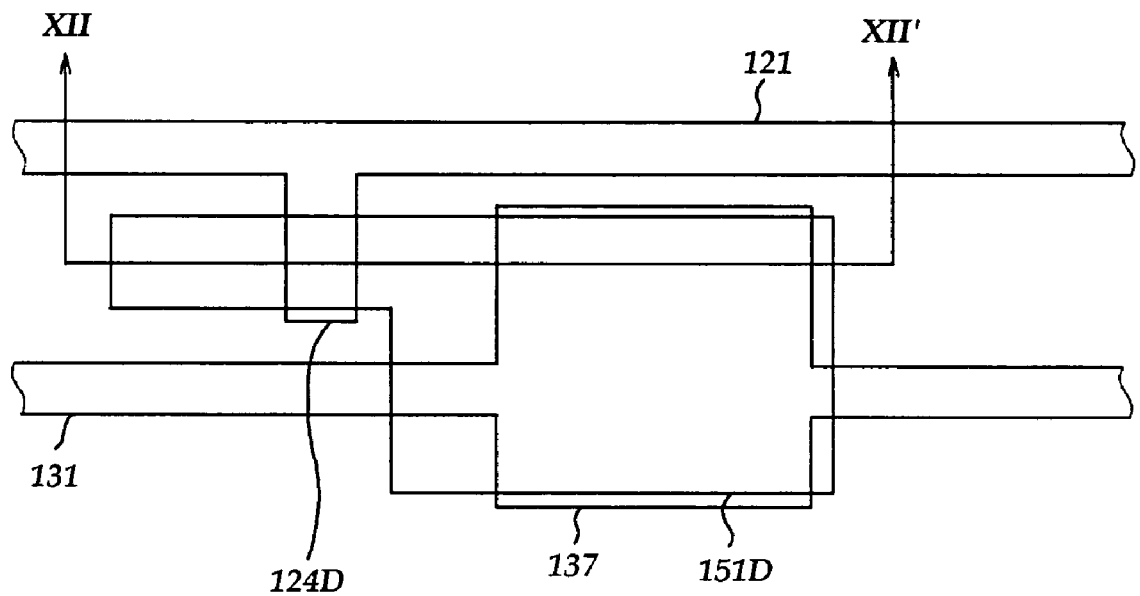
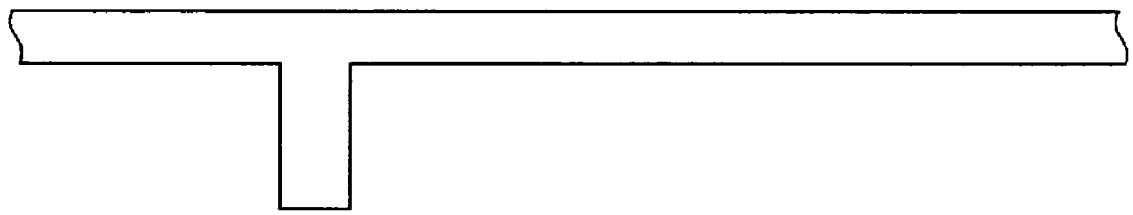

FIG. 14
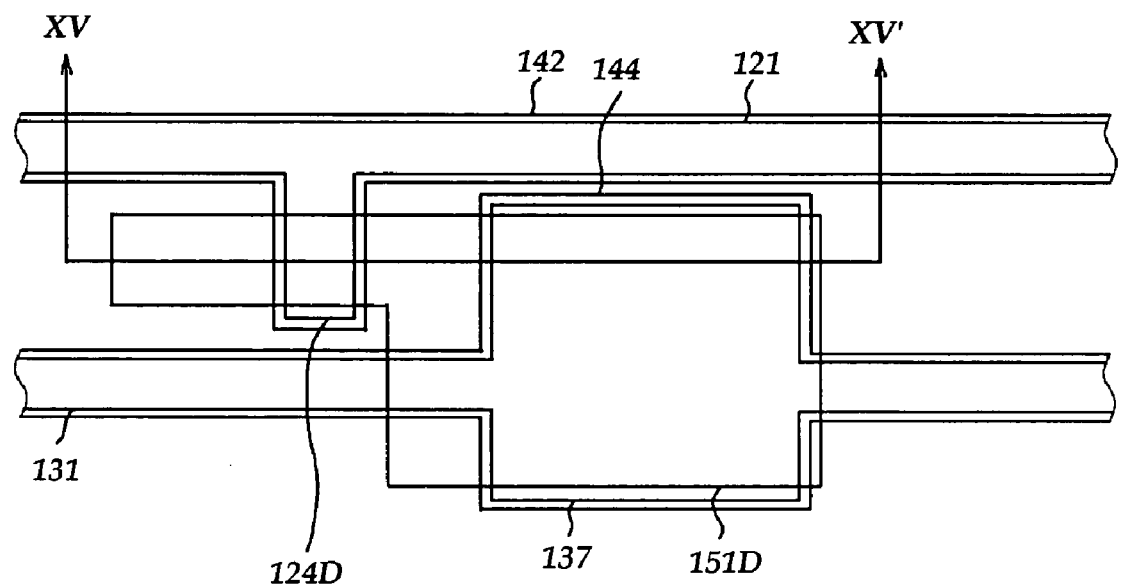
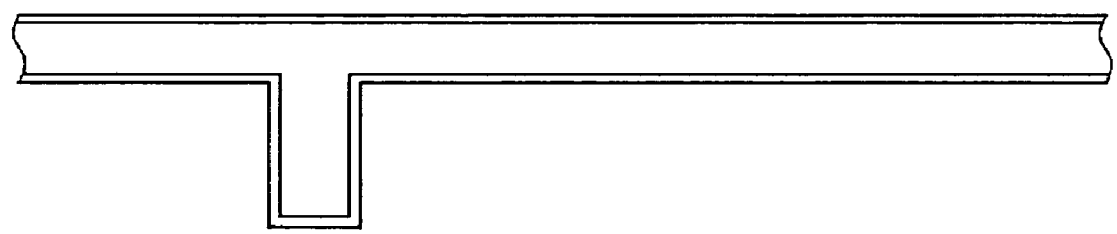

FIG. 22
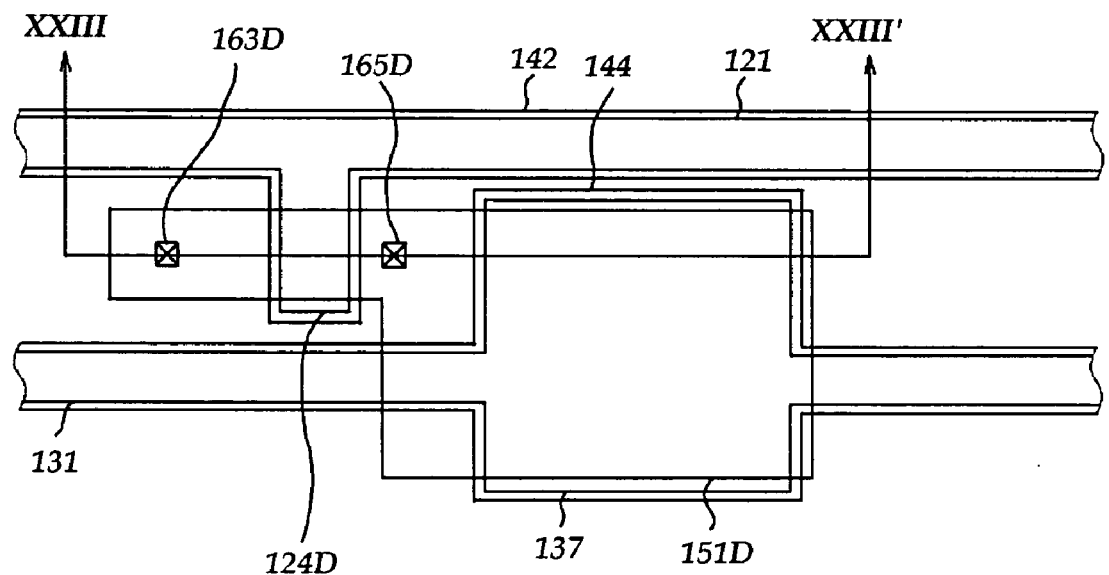
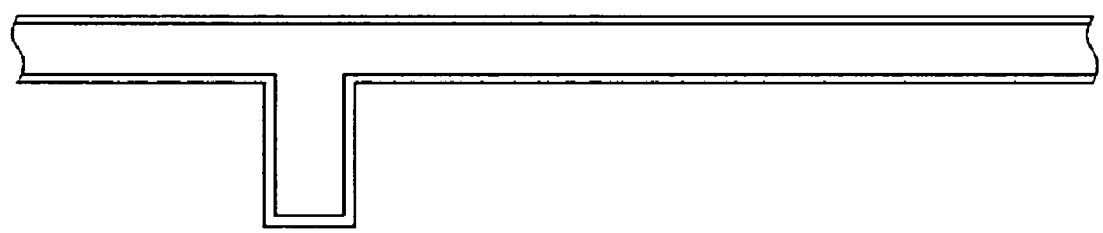

THIN FILM TRANSISTOR ARRAY PANEL AND MANUFACTURING METHOD THEREOF

BACKGROUND OF THE INVENTION (a) Field of the Invention

The present invention relates to a thin film transistor array panel and a manufacturing method thereof.

(b) Description of Related Art

A flat panel display such as a liquid crystal display (LCD) and an organic light emitting display (OLED) includes a display panel including a plurality of pixel electrodes, a plurality of thin film transistors (TFTs) connected thereto, and a plurality of signal lines connected to the TFTs, a plurality of drivers for driving the display panel, and a controller for controlling the drivers.

The signal lines include gate lines for transmitting gate signals from the drivers to the TFTs and data lines for transmitting data signals from the drivers to the TFTs.

A TFT includes a semiconductor layer of amorphous silicon or polysilicon, a gate electrode connected to the gate line, a source electrode connected to the data line, and a drain electrode connected to the pixel electrode.

A TFT including a polysilicon layer usually places the gate electrode on the polysilicon layer and the polysilicon layer includes lightly doped regions disposed between a channel region and source and drain regions for reducing punch through, etc.

The heavily doped regions such as source and drain regions and the lightly doped regions are often formed by making a gate electrode include two metal films having different widths and by using the two metal films as masks for forming the two regions.

However, it is difficult to differentiate the two metal films using only one lithography step and to define the length of the lightly doped regions such that the process time is long and the productivity is decreased.

In addition, a gate insulating film disposed on the polysilicon layer requires high energy for ion implantation for forming the source and the drain regions, which in turn requires high voltage to be exerted on an implantation chamber. The high voltage of the chamber may be dangerous and may damage on the TFTs.

SUMMARY OF THE INVENTION

A thin film transistor array panel is provided, which includes: a substrate; a first polysilicon member that is formed on the substrate and includes an intrinsic region, at least one first extrinsic region, and at least one second extrinsic region disposed between the intrinsic region and the at least one first extrinsic region and having an impurity concentration lower than the at least one first extrinsic region; a first insulator formed on the first polysilicon member and having an edge substantially coinciding with a boundary between the at least one first extrinsic region and the at least one second extrinsic region; and a first electrode formed on the first insulator and having an edge substantially coinciding with a boundary between the intrinsic region and the at least one second extrinsic region.

The thin film transistor array panel may further include a second insulator disposed between the first polysilicon member and the first insulator. The first and the second insulators may have coinciding edges. Alternatively, the second insulator is wider than the first insulator.

The thin film transistor array panel may further include: a second polysilicon member that is formed on the substrate and includes an intrinsic region and at least one extrinsic region adjacent to the intrinsic region; a second insulator formed on the second polysilicon member and having an edge substantially coinciding with a boundary between the intrinsic region and the at least one extrinsic region of the second polysilicon member; and a second electrode formed on the first insulator and having edges substantially coinciding with edges of the second insulator.

The at least one extrinsic region of the second polysilicon member may include impurity having a conductivity opposite to a conductivity of impurity included in the at least one first extrinsic region of the first polysilicon member.

The at least one first extrinsic region may include a pair of source and drain regions disposed opposite each other with respect to the intrinsic region and the at least one second extrinsic region may include a pair of lightly doped regions disposed opposite each other with respect to the intrinsic region.

The first polysilicon member may further include a storage region disposed adjacent to the drain region opposite the intrinsic region.

The thin film transistor array panel may further include: a data line connected to the source region; and a pixel electrode connected to the drain region.

The at least one second extrinsic region may have a thickness smaller than the at least one first extrinsic region.

A method of manufacturing a thin film transistor array panel is provided, which includes: forming a polysilicon member on a substrate; depositing a first gate insulating film; depositing a conductive film; forming a photoresist; patterning the conductive film by isotropic etching using the photoresist as an etch mask to form a gate electrode; patterning the first gate insulating film by anisotropic etching using the photoresist as an etch mask to form a first gate insulator; removing the photoresist; forming source and drain regions having a first impurity concentration by introducing impurity into the polysilicon member using the first gate insulator as a mask; and forming lightly doped regions having a second impurity concentration lower than the first impurity concentration by introducing impurity into the polysilicon member using the gate electrode as a mask.

The introduction of the impurity for the formation of source and drain regions may be performed by plasma enhanced chemical vapor deposition or plasma emulsion. The introduction of the impurity for the formation of source and drain regions may be performed using energy of about 3-40 EV.

The introduction of the impurity for the formation of lightly doped regions may be performed by using a scanning equipment or an ion beam equipment. The introduction of the impurity for the formation of lightly doped regions may be performed using energy higher than the introduction of the impurity for the formation of source and drain regions.

The method may further include: depositing a second gate insulating film between the polysilicon member and the first gate insulating film. The method may further include: patterning the second gate insulating film to form a second gate insulator having substantially the same planar shape as the first gate insulator.

The method may further include: patterning the conductive film by isotropic etching using the photoresist as an etch mask to form a storage electrode; and patterning the first gate insulating film by anisotropic etching using the photoresist as an etch mask to form a second gate insulator under the storage electrode.

The method may further include: forming a data line connected to the source region; and forming a pixel electrode connected to the drain region.

BRIEF DESCRIPTION OF THE DRAWINGS

The present invention will become more apparent by describing embodiments thereof in detail with reference to the accompanying drawing in which:

FIG. 11 is a layout view of the TFT array panel in the step following the step shown in FIGS. 9 and 10;

FIG. 14 is a layout view of the TFT array panel in the step following the step shown in FIGS. 11-13;

FIG. 22 is a layout view of the TFT array panel in the step following the step shown in FIG. 20;

DETAILED DESCRIPTION OF EMBODIMENTS

Figure 1:
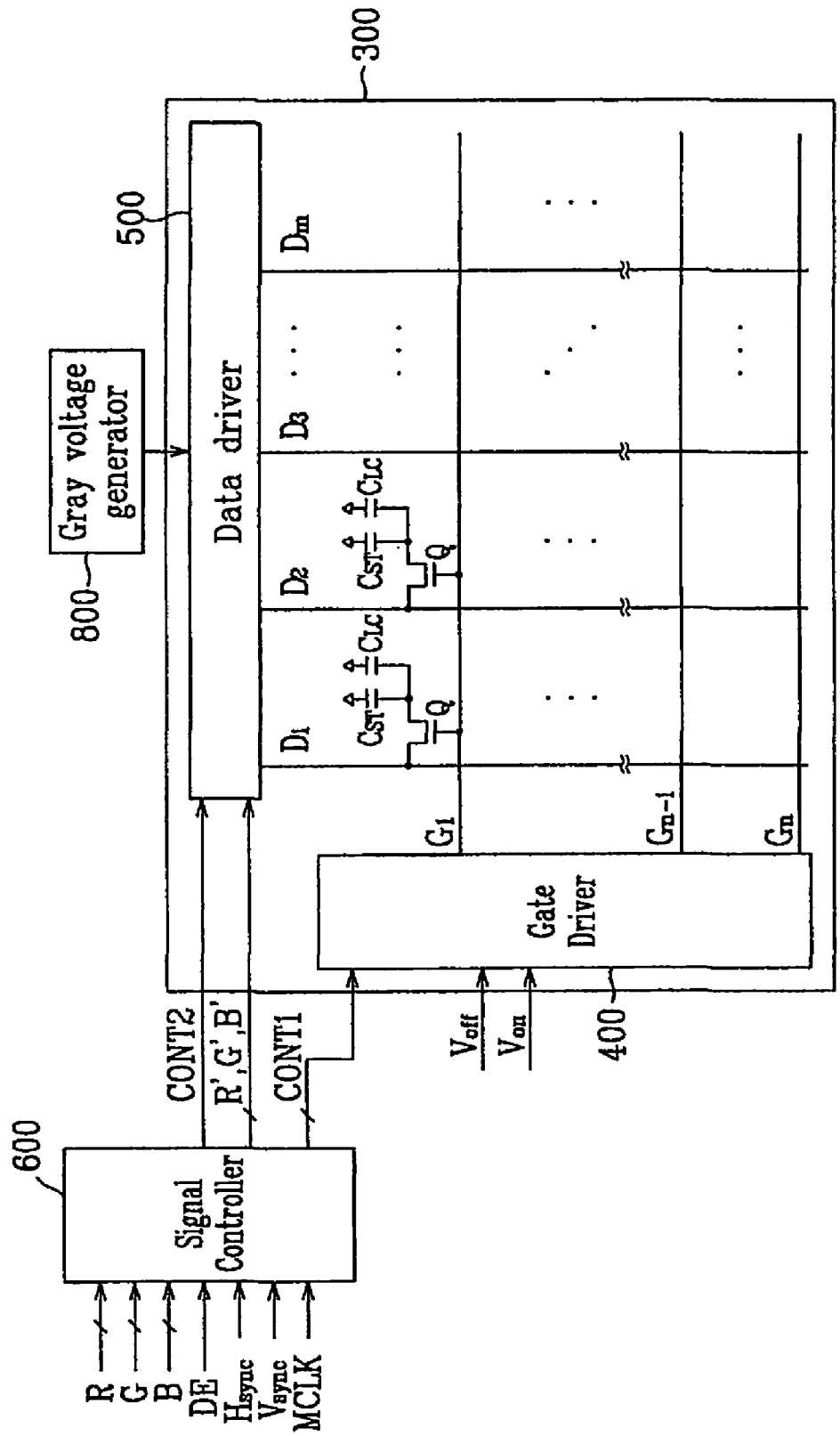
FIG. 1 is a block diagram of an LCD according to an embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. Like numerals refer to like elements throughout.

In the drawings, the thickness of layers and regions are exaggerated for clarity. Like numerals refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Then, liquid crystal displays as an example of display device according to embodiments of the present invention will be described with reference to the accompanying drawings.

Figure 2:
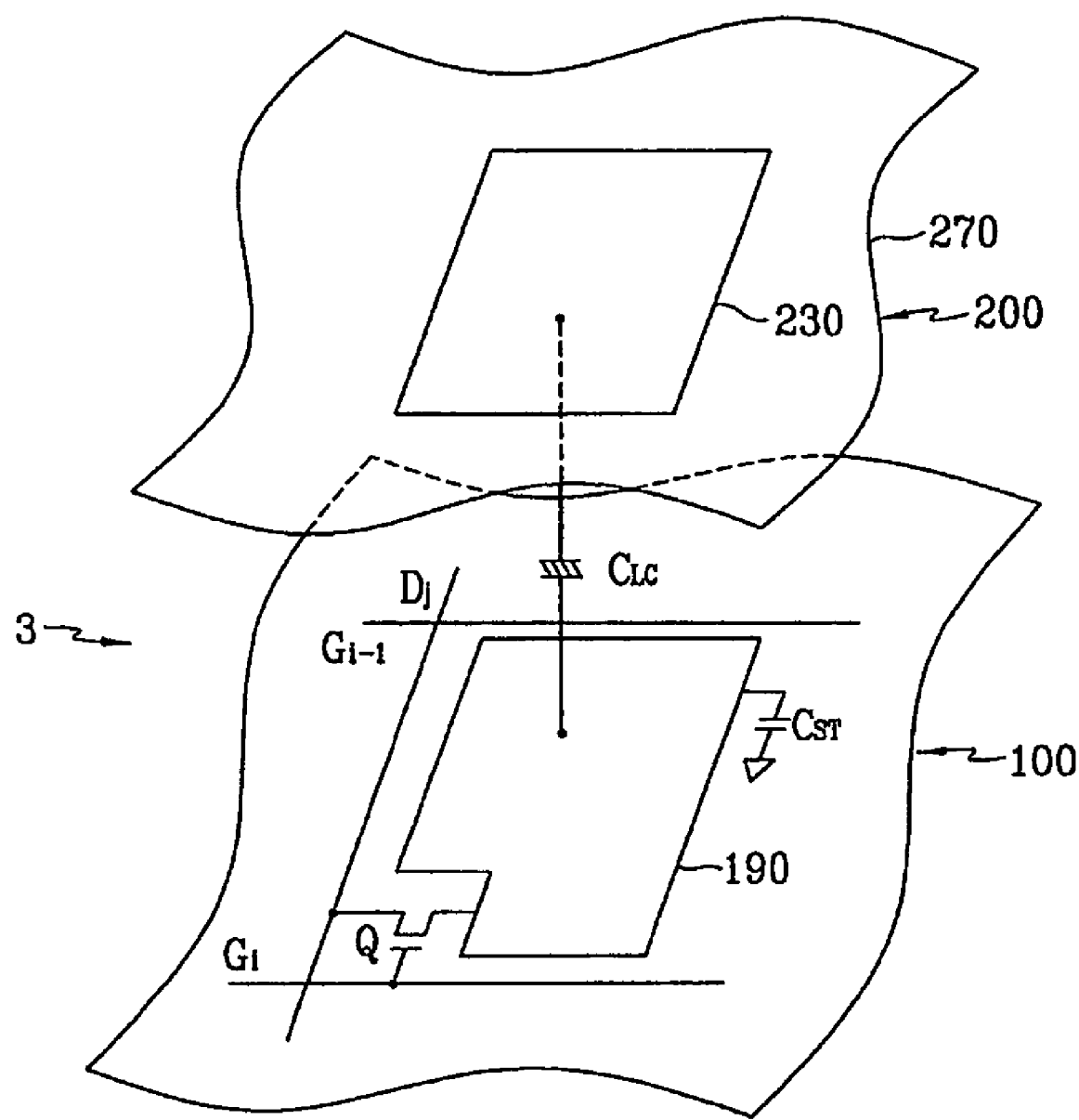
FIG. 2 is an equivalent circuit diagram of a pixel of an LCD according to an embodiment of the present invention.

Referring to FIGS. 1 and 2, an LCD according to an embodiment of the present invention will be described in detail.

FIG. 1 is a block diagram of an LCD according to an embodiment of the present invention, and FIG. 2 is an equivalent circuit diagram of a pixel of an LCD according to an embodiment of the present invention.

Referring to FIG. 1, an LCD according to an embodiment includes a LC panel assembly 300, a gate driver 400 and a data driver 500 that are connected to the panel assembly 300, a gray voltage generator 800 connected to the data driver 500, and a signal controller 600 controlling the above elements.

Referring to FIG. 1, the panel assembly 300 includes a plurality of display signal lines $G_1$-$G_n$ and $D_1$-$D_m$ and a plurality of pixels connected thereto and arranged substantially in a matrix. In a structural view shown in FIG. 2, the panel assembly 300 includes lower and upper panels 100 and 200 and a LC layer interposed therebetween.

The display signal lines $G_1$-$G_n$ and $D_1$-$D_m$ are disposed on the lower panel 100 and include a plurality of gate lines $G_1$-$G_n$ transmitting gate signals (also referred to as "scanning signals"), and a plurality of data lines $D_1$-$D_m$ transmitting data signals. The gate lines $G_1$-$G_n$ extend substantially in a row direction and substantially parallel to each other, while the data lines $D_1$-$D_m$ extend substantially in a column direction and substantially parallel to each other.

Each pixel includes a switching element Q connected to the signal lines $G_1$-$G_n$ and $D_1$-$D_m$, and a LC capacitor $C_{LC}$ and a storage capacitor $C_{ST}$ that are connected to the switching element Q. If unnecessary, the storage capacitor $C_{ST}$ may be omitted.

The switching element Q including a TFT is provided on a lower panel 100 and has three terminals: a control terminal connected to one of the gate lines $G_1$-$G_n$; an input terminal connected to one of the data lines $D_1$-$D_m$; and an output terminal connected to both the LC capacitor $C_{LC}$ and the storage capacitor $C_{ST}$.

The LC capacitor $C_{LC}$ includes a pixel electrode 190 provided on the lower panel 100 and a common electrode 270 provided on an upper panel 200 as two terminals. The LC layer 3 disposed between the two electrodes 190 and 270 functions as dielectric of the LC capacitor $C_{LC}$. The pixel electrode 190 is connected to the switching element Q, and the common electrode 270 is supplied with a common voltage Vcom and covers an entire surface of the upper panel 200. Unlike FIG. 2, the common electrode 270 may be provided on the lower panel 100, and both electrodes 190 and 270 may have shapes of bars or stripes.

The storage capacitor $C_{ST}$ is an auxiliary capacitor for the LC capacitor $C_{LC}$. The storage capacitor $C_{ST}$ includes the pixel electrode 190 and a separate signal line, which is provided on the lower panel 100, overlaps the pixel electrode 190 via an insulator, and is supplied with a predetermined voltage such as the common voltage Vcom. Alternatively, the storage capacitor $C_{ST}$ includes the pixel electrode 190 and an adjacent gate line called a previous gate line, which overlaps the pixel electrode 190 via an insulator.

For color display, each pixel uniquely represents one of three primary colors (i.e., spatial division) or each pixel represents three primary colors in turn (i.e., time division) such that spatial or temporal sum of the three primary colors are recognized as a desired color. FIG. 2 shows an example of the spatial division that each pixel is provided with a color filter 230, one of red, green and blue color filters, in an area of the upper panel 200 facing the pixel electrode 190. Alternatively, the color filter 230 is provided on or under the pixel electrode 190 on the lower panel 100.

One or more polarizers (not shown) are attached to the panels 100 and 200.

Referring to FIG. 1 again, the gray voltage generator 800 generates two sets of a plurality of gray voltages related to the transmittance of the pixels. The gray voltages in one set have a positive polarity with respect to the common voltage Vcom, while those in the other set have a negative polarity with respect to the common voltage Vcom.

The gate driver 400 is connected to the gate lines $G_1$-$G_n$ of the panel assembly 300 and synthesizes the gate-on voltage Von and the gate-off voltage Voff from an external device to generate gate signals for application to the gate lines $G_1$-$G_n$. The gate driver 400 is mounted on the panel assembly 300 and it may include a plurality of IC (integrated circuit) chips.

The data driver 500 is connected to the data lines $D_1$-$D_m$ of the panel assembly 300 and applies data voltages, which are selected from the gray voltages supplied from the gray voltage generator 800, to the data lines $D_1$-$D_m$. The data driver 500 is also mounted on the panel assembly 300 and it may include a plurality of IC chips, too.

The IC chips of the drivers 400 and 500 may be mounted on flexible printed circuit (FPC) films in a TCP (tape carrier package) type which are attached to the LC panel assembly 300. Alternately, the drivers 400 and 500 may be integrated into the panel assembly 300 along with the display signal lines $G_1$-$G_n$ and $D_1$-$D_m$ and the TFT switching elements Q.

The signal controller 600 controls the gate driver 400 and the data driver 500 and it may be mounted on a printed circuit board (PCB).

A TFT array panel for an LCD according to an embodiment of the present invention is now described in detail with reference to FIGS. 3-5 as well as FIGS. 1 and 2.

Figure 3:
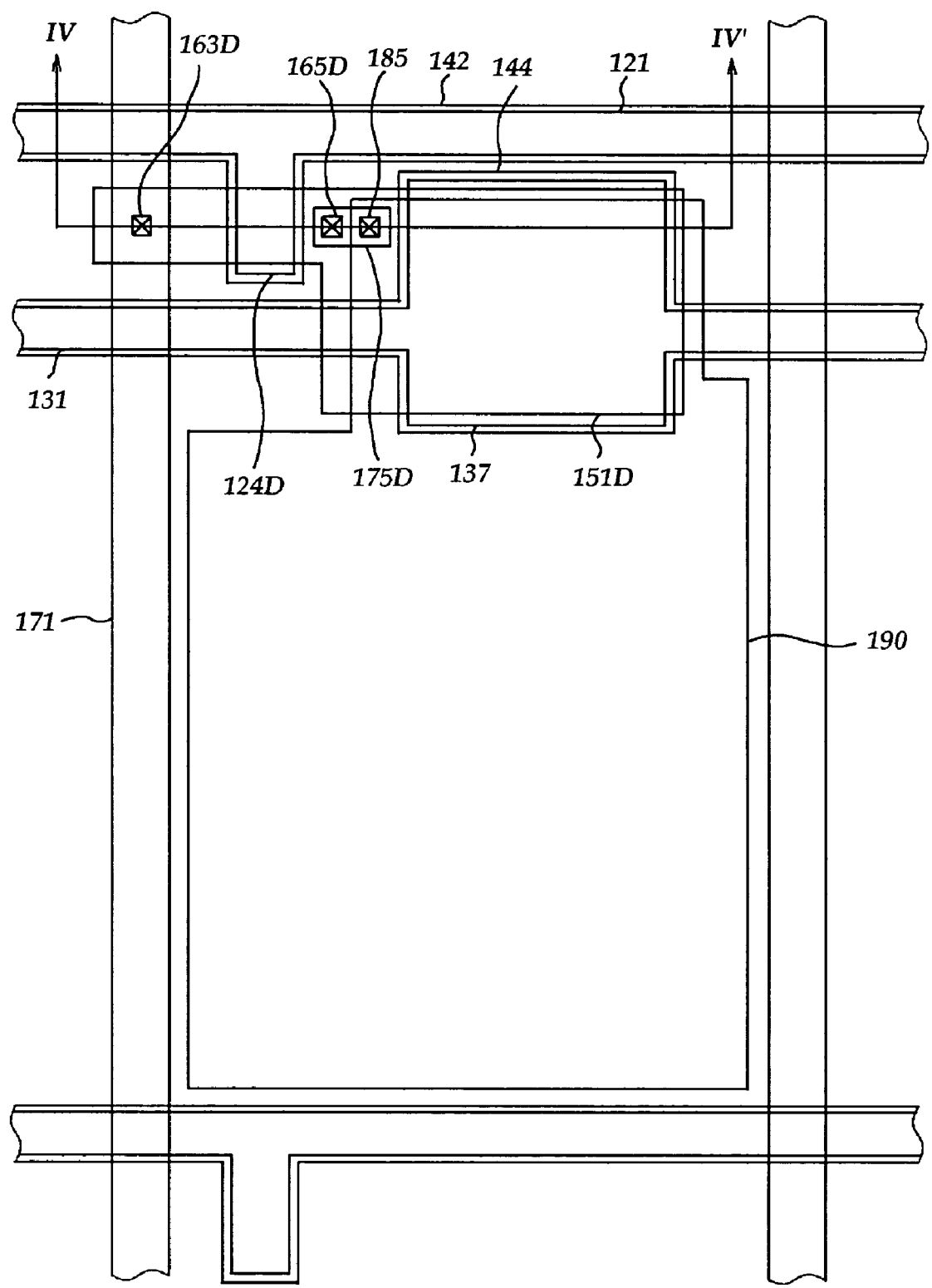
FIG. 3 is a layout view of the TFT array panel shown in FIGS. 1 and 2 according to an embodiment of the present invention.
Figure 4:
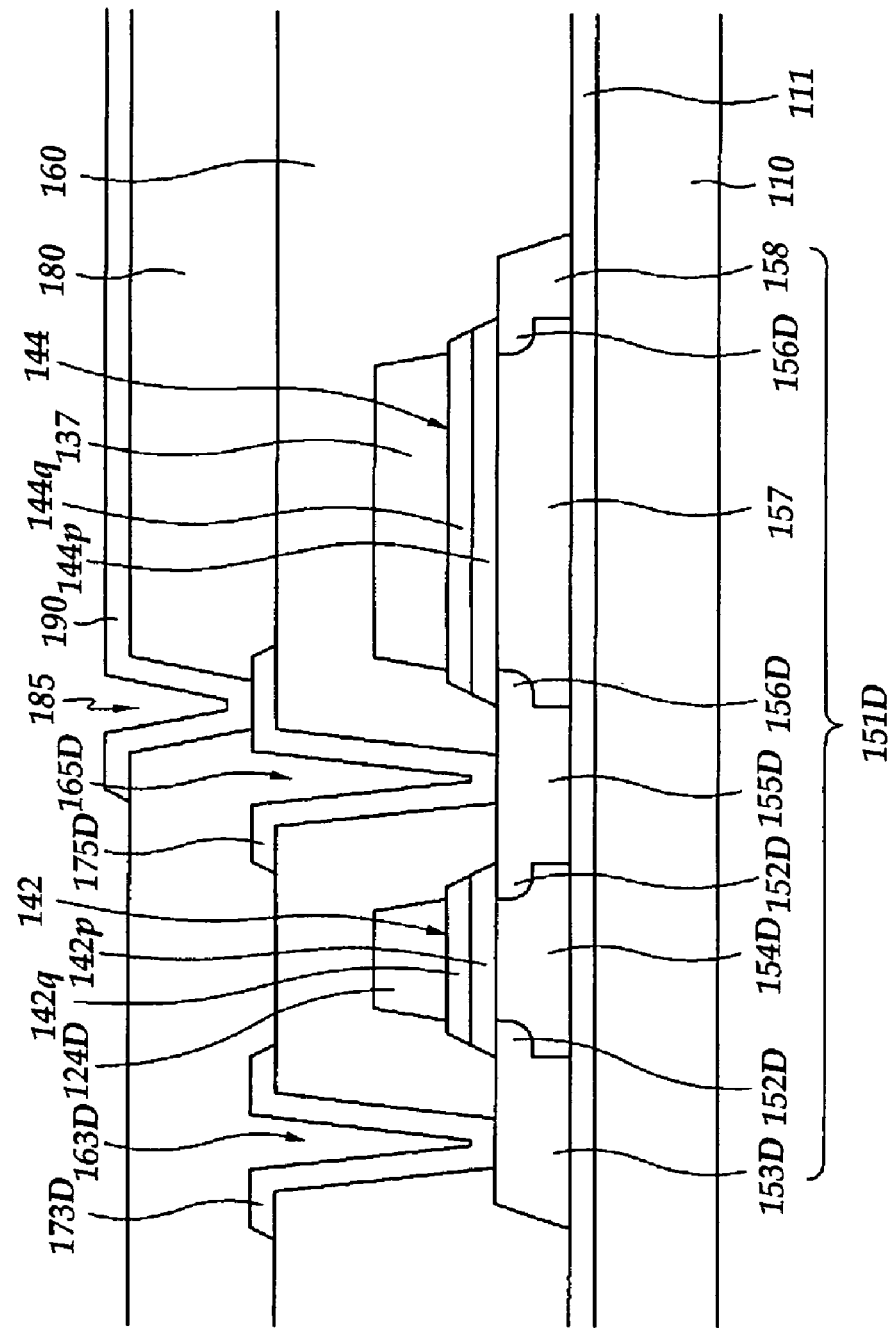
FIG. 4 is a sectional view of the display area shown in FIG. 3 taken along the lines III-III'.
Figure 5:
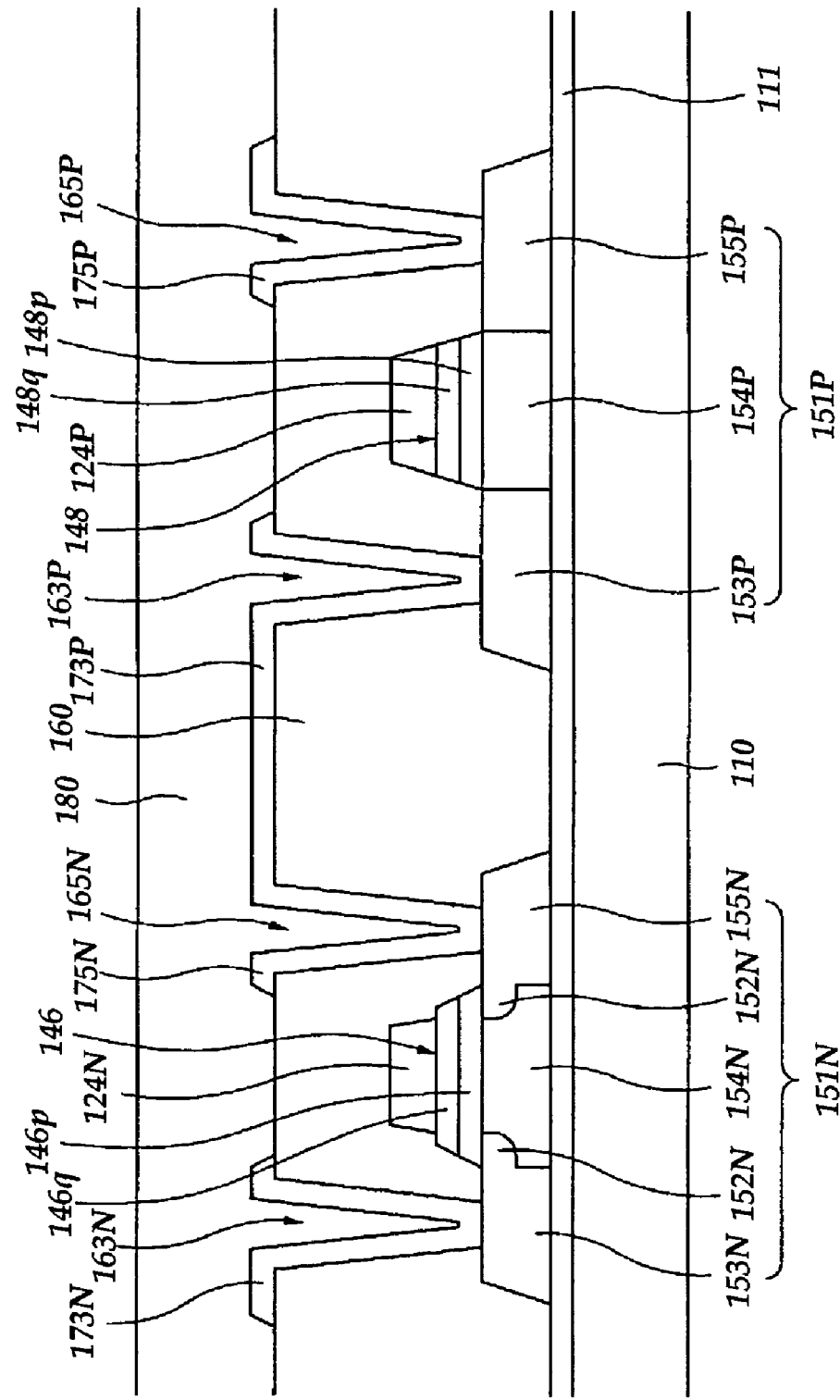
FIG. 5 is a sectional view of a CMOS transistor of the driver shown in FIGS. 1 and 2.

FIG. 3 is a layout view of the TFT array panel shown in FIGS. 1 and 2 according to an embodiment of the present invention, FIG. 4 is a sectional view of the display area shown in FIG. 3 taken along the lines III-III', and FIG. 5 is a sectional view of a CMOS transistor of the driver shown in FIGS. 1 and 2.

A blocking film 111 preferably made of silicon oxide ($SiO_2$) or silicon nitride (SiNx) is formed on an insulating substrate 110 such as transparent glass, quartz or sapphire. The blocking film 111 may have a dual-layered structure.

A plurality of semiconductor islands 151D, 151N and 151P preferably made of polysilicon are formed on the blocking film 111. Each of the semiconductor islands 151D, 151N and 151P includes a plurality of extrinsic regions containing N type or P type conductive impurity and at least one intrinsic region hardly containing conductive impurity.

Concerning a semiconductor island 151D for a pixel, the intrinsic regions include a channel region 154D and a storage region 157, and the extrinsic regions are doped with N type impurity such as phosphorous (P) and arsenic (As) and include a plurality of heavily doped regions such as source and drain regions 153D and 155D separated from each other with respect to the channel region 154D and dummy regions 158 and a plurality of lightly doped regions 152D and 156D disposed between the intrinsic regions 154D and 157 and the heavily doped regions 153D, 155D and 158.

Regarding a semiconductor island 151N for an N type TFT, the intrinsic region includes a channel region 154N, and the extrinsic regions are also doped with N type impurity and include a plurality of heavily doped regions such as source and drain regions 153N and 155N separated from each other with respect to the channel region 154N and a plurality of lightly doped regions 152N disposed between the channel region 154N and the heavily doped regions 153N and 155N.

Concerning a semiconductor island 151P for an P type TFT, the intrinsic region includes a channel region 154N, and the extrinsic regions are doped with P type impurity such as boron (B) and gallium (Ga) and include a plurality of heavily doped regions such as source and drain regions 153N and 155N separated from each other with respect to the channel region 154N and a plurality of lightly doped regions 152N disposed between the channel region 154N and the heavily doped regions 153N and 155N.

The lightly doped regions 152D and 152N and 156D have relatively small thickness and length compared with the heavily doped regions 153D, 153N, 155D, 155N and 158 and are disposed close to surfaces of the semiconductor islands 151D and 151N. The lightly doped regions 152D/152N disposed between the source region 153D/153N and the channel region 154D/154N and between the drain region 155D/155N and the channel region 154D/154N are referred to as "lightly doped drain (LDD) regions" and they prevent leakage current of TFTs. The LDD regions may be substituted with offset regions that contain substantially no impurity.

A plurality of gate insulators 142, 144, 146 and 148 are formed on the semiconductor islands 151D, 151N and 151P. Each of the gate insulators 142, 144, 146 and 148 include a lower insulator 142p, 144p, 146p and 148p preferably made of silicon oxide and an upper insulator 142q, 144q, 146q and 148q preferably made of silicon nitride. The gate insulators 142 and 144 extend substantially in a transverse direction.

A plurality of gate conductors including a plurality of gate lines 121, a plurality of storage electrode lines 131, a plurality of gate electrodes 124N for N type TFTs, and a plurality of gate electrodes 124P for P type TFTs are formed on the gate insulators 142, 144, 146 and 148, respectively.

The gate lines 121 for transmitting gate signals extend substantially in a transverse direction and include a plurality of gate electrodes 124D for pixels protruding downward to overlap the channel areas 154D of the semiconductor islands 151D. Each gate line 121 may include an expanded end portion having a large area for contact with another layer or an external driving circuit. The gate lines 121 may be directly connected to a gate driving circuit for generating the gate signals, which may be integrated on the substrate 110.

The storage electrode lines 131 are supplied with a predetermined voltage such as a common voltage and include a plurality of storage electrodes 137 protruding upward and downward and overlapping the storage regions 157 of the semiconductor islands 151D.

The gate lines 121, the storage electrode lines 131, and the gate electrodes 124N are narrower than the gate insulators 142, 144 and 146 by a width of the lightly doped regions 152D, 156D and 152N, respectively. In particular, the gate insulators 142, 144 and 146 overlap the channel regions 154D for pixels and the light doped regions 152D adjacent thereto, the storage regions 157 and the lightly doped regions 156D adjacent thereto, and the channel regions 154N for N type TFTs and the light doped regions 152N adjacent thereto, respectively, while the gate lines 121, the storage electrode lines 131, and the gate electrodes 124N overlap the channel regions 154D, the storage regions 157, and the channel regions 154N, respectively. On the contrary, the gate electrodes 124P for P type TFTs have substantially the same planar shape as the channel regions 154P.

The gate conductors 121, 131, 124N and 124P are preferably made of low resistivity material including Al containing metal such as Al and Al alloy (e.g. Al—Nd), Ag containing metal such as Ag and Ag alloy, Cu containing metal such as Cu and Cu alloy, Mo containing metal such as Mo and Mo alloy, Cr, Ti and Ta. The gate conductors 121, 131, 124N and 124P may have a multi-layered structure including two films having different physical characteristics. One of the two films is preferably made of low resistivity metal including Al containing metal, Ag containing metal, and Cu containing metal for reducing signal delay or voltage drop in the gate conductors 121, 131, 124N and 124P. The other film is preferably made of material such as Cr, Mo and Mo alloy, Ta or Ti, which has good physical, chemical, and electrical contact characteristics with other materials such as indium tin oxide (ITO) or indium zinc oxide (IZO). Good examples of the combination of the two films are a lower Cr film and an upper Al—Nd alloy film and a lower Al film and an upper Mo film.

In addition, the lateral sides of the gate conductors 121, 131, 124N and 124P are inclined relative to a surface of the substrate 110, and the inclination angle thereof ranges about 30-80 degrees.

An interlayer insulating layer 160 is formed on the gate conductors 121, 131, 124N and 124P. The interlayer insulating layer 160 is preferably made of photosensitive organic material having a good flatness characteristic, low dielectric insulating material such as a-Si:C:O and a-Si:O:F formed by plasma enhanced chemical vapor deposition (PECVD), or inorganic material such as silicon nitride and silicon oxide.

The interlayer insulating layer 160 has a plurality of contact holes 163D, 163N, 163P, 165D, 165N and 165P exposing the source regions 153D, 153N and 153P and the drain regions 155D, 155N and 155P.

A plurality of data conductors including a plurality of data lines 171, a plurality of drain electrodes 175D for pixels, a plurality of source and drain electrodes 173N and 175N for N type TFTs, and a plurality of source and drain electrodes 173P and 175P for P type TFTs are formed on the interlayer insulating layer 160.

The data lines 171 for transmitting data voltages extend substantially in the longitudinal direction and intersect the gate lines 121. Each data line 171 includes a plurality of source electrodes 173D for pixels connected to the source regions 153D through the contact holes 163D. Each data line 171 may include an expanded end portion having a large area for contact with another layer or an external driving circuit. The data lines 171 may be directly connected to a data driving circuit for generating the gate signals, which may be integrated on the substrate 110.

The source electrodes 173N and 173P are connected to the source regions 153N and 153P through the contact holes 163N and 163P, respectively.

The drain electrodes 175D/175N/175P are separated from the source electrodes 173D/173N/173P and connected to the drain regions 155D/155N/155P through the contact holes 165D/165N/165P. The drain electrodes 175N for N type TFTs and the source electrodes 173P for P type TFTs are connected to each other.

The data conductors 171, 175D, 173N, 175N, 173P and 175P are preferably made of refractory metal including Cr, Mo, Ti, Ta or alloys thereof. They may have a multi-layered structure preferably including a low resistivity film and a good contact film. A good example of the multi-layered structure includes a Mo lower film, an Al middle film, and a Mo upper film as well as the above-described combinations of a Cr lower film and an Al—Nd upper film and an Al lower film and a Mo upper film.

Like the gate conductors 121, 131, 124N and 124P, the data conductors 171, 175D, 173N, 175N, 173P and 175P have tapered lateral sides relative to a surface of the substrate 110, and the inclination angles thereof range about 30-80 degrees.

A passivation layer 180 is formed on the data conductors 171, 175D, 173N, 175N, 173P and 175P and the interlayer insulating layer 160. The passivation layer 180 is also preferably made of photosensitive organic material having a good flatness characteristic, low dielectric insulating material such as a-Si:C:O and a-Si:O:F formed by PECVD, or inorganic material such as silicon nitride and silicon oxide.

The passivation layer 180 has a plurality of contact holes 185 exposing the drain electrodes 175D. The passivation layer 180 may further has a plurality of contact holes (not shown) exposing end portions of the data lines 171 and the passivation layer 180 and the interlayer insulating layer 160 may have a plurality of contact holes (not shown) exposing end portions of the gate lines 121.

A plurality of pixel electrodes 190, which are preferably made of at least one of transparent conductor such as ITO or IZO and opaque reflective conductor such as Al or Ag, are formed on the passivation layer 180.

The pixel electrodes 190 are physically and electrically connected to the drain electrodes 175D through the contact holes 185 such that the pixel electrodes 190 receive the data voltages from the drain regions 155 via the drain electrodes 175D.

Referring back to FIG. 2, the pixel electrodes 190 supplied with the data voltages generate electric fields in cooperation with the common electrode 270 on the other panel 200, which determine orientations of liquid crystal molecules in a liquid crystal layer 3 disposed therebetween or cause currents in light emitting members (not shown) disposed therebetween.

As described above, a pixel electrode 190 and a common electrode 270 form a liquid crystal capacitor and a pixel electrode 190 and a drain region 155D connected thereto and a storage electrode line 131 including the storage electrodes 137 form a storage capacitor.

A plurality of contact assistants or connecting members (not shown) may be also formed on the passivation layer 180 such that they are connected to the exposed end portions of the gate lines 121 or the data lines 171.

Now, a method of manufacturing the TFT array panel shown in FIGS. 2-5 according to an embodiment of the present invention will be now described in detail with reference to FIGS. 6 to 30 as well as FIGS. 3-5.

Figure 6:
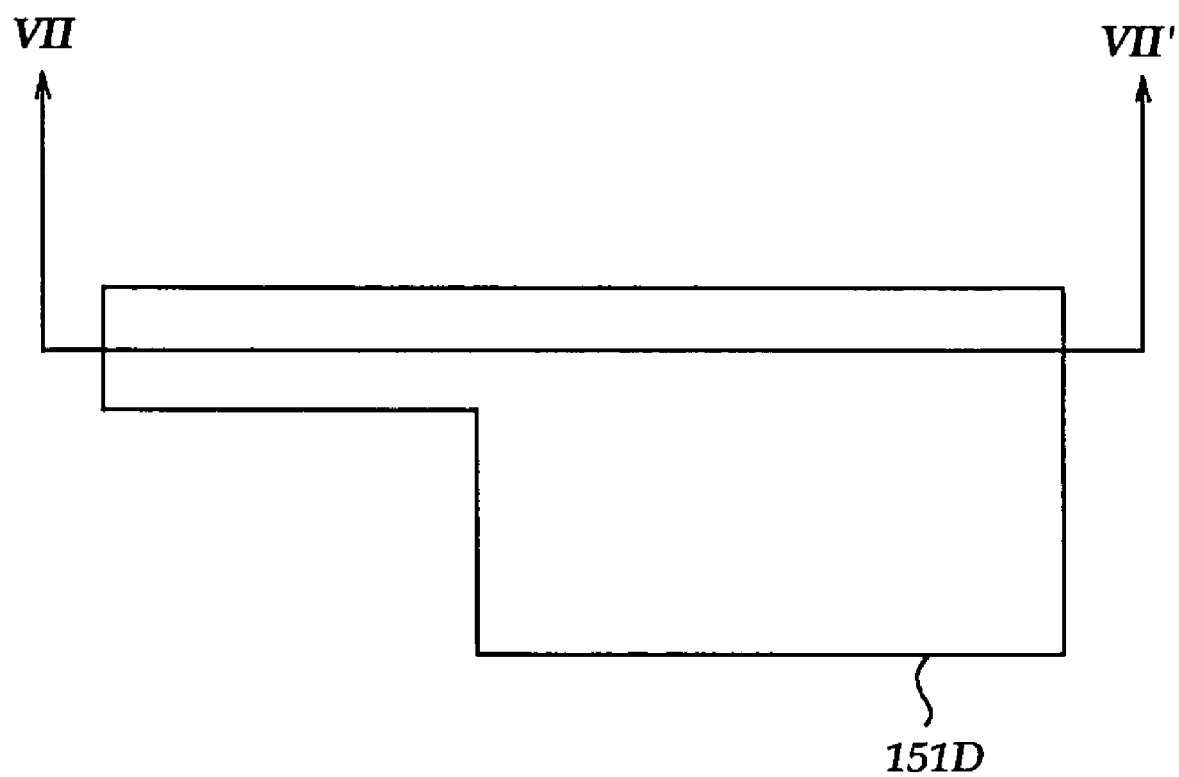
FIG. 6 is a layout view of the TFT array panel shown in FIGS. 3 and 4 in the first step of a manufacturing method thereof according to an embodiment of the present invention.
Figure 7:
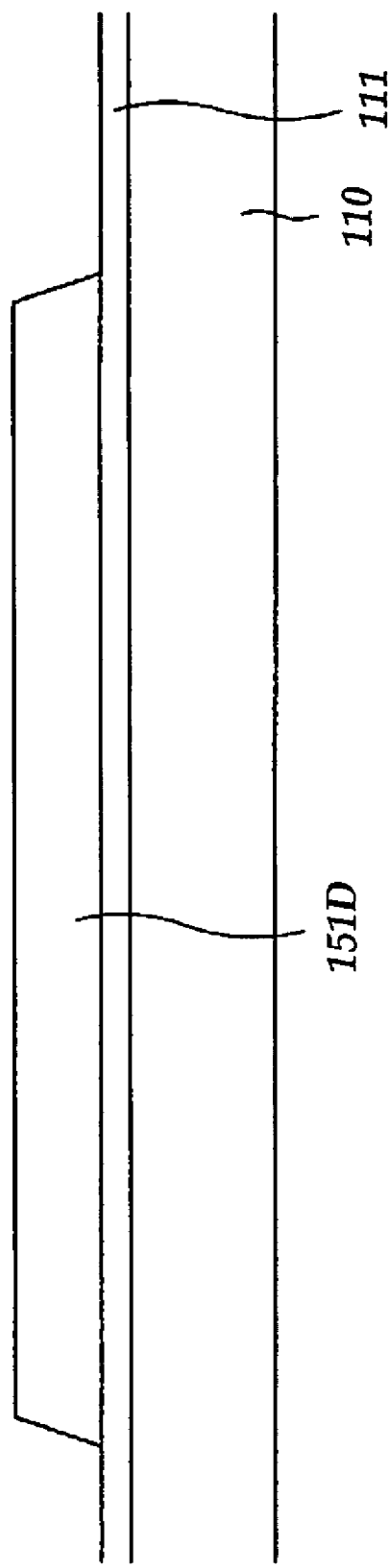
FIG. 7 is a sectional view of the TFT array panel shown in FIG. 6 taken along the line VII-VII'.
Figure 8:
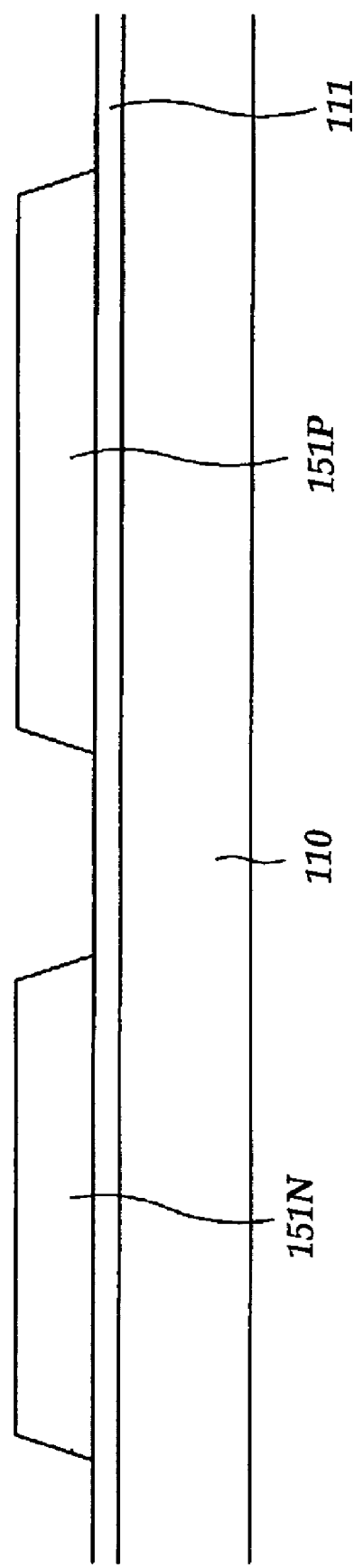
FIG. 8 is a sectional view of the CMOS transistor shown in FIG. 5 in the step shown in FIGS. 6 and 7.
Figure 9:
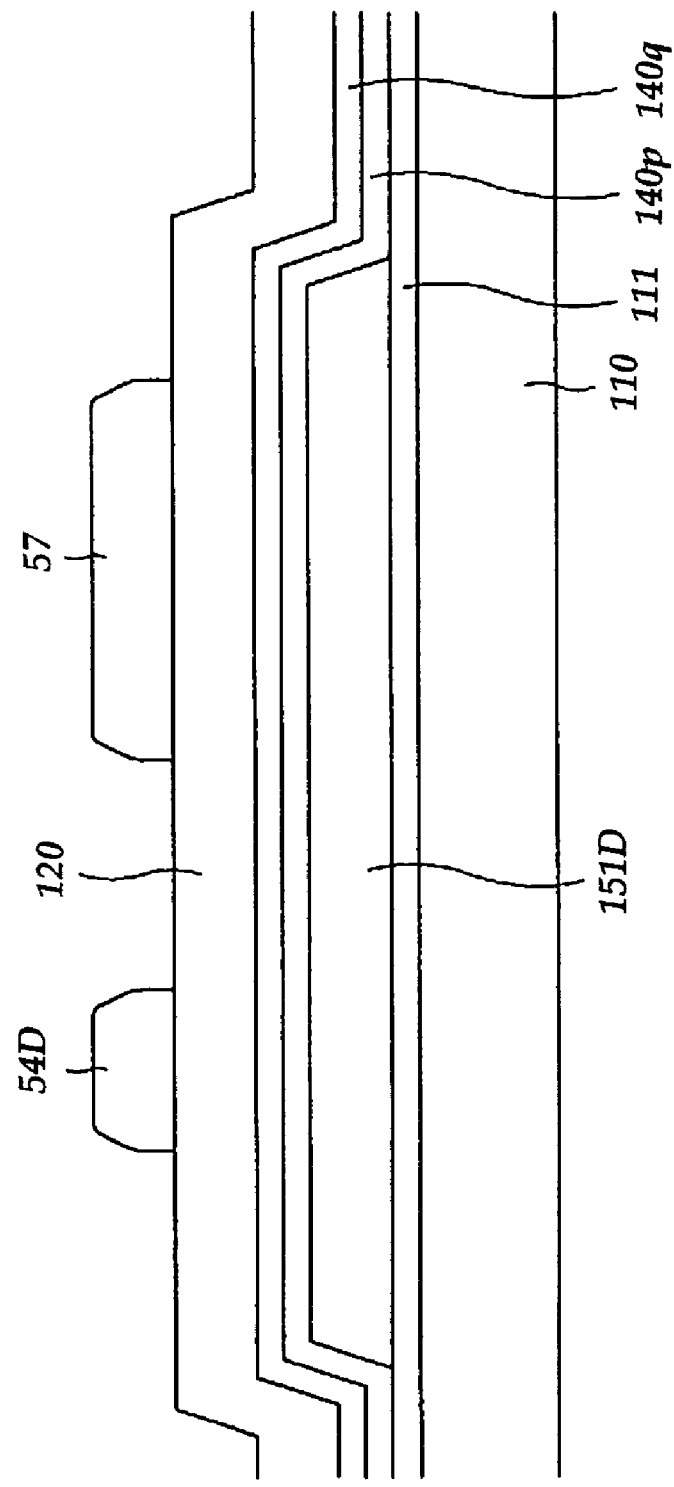
FIG. 9 is a sectional view of the TFT array panel shown in FIG. 6 taken along the line VII-VII', and illustrate the step following the step shown in FIGS. 7 and 8.
Figure 10:
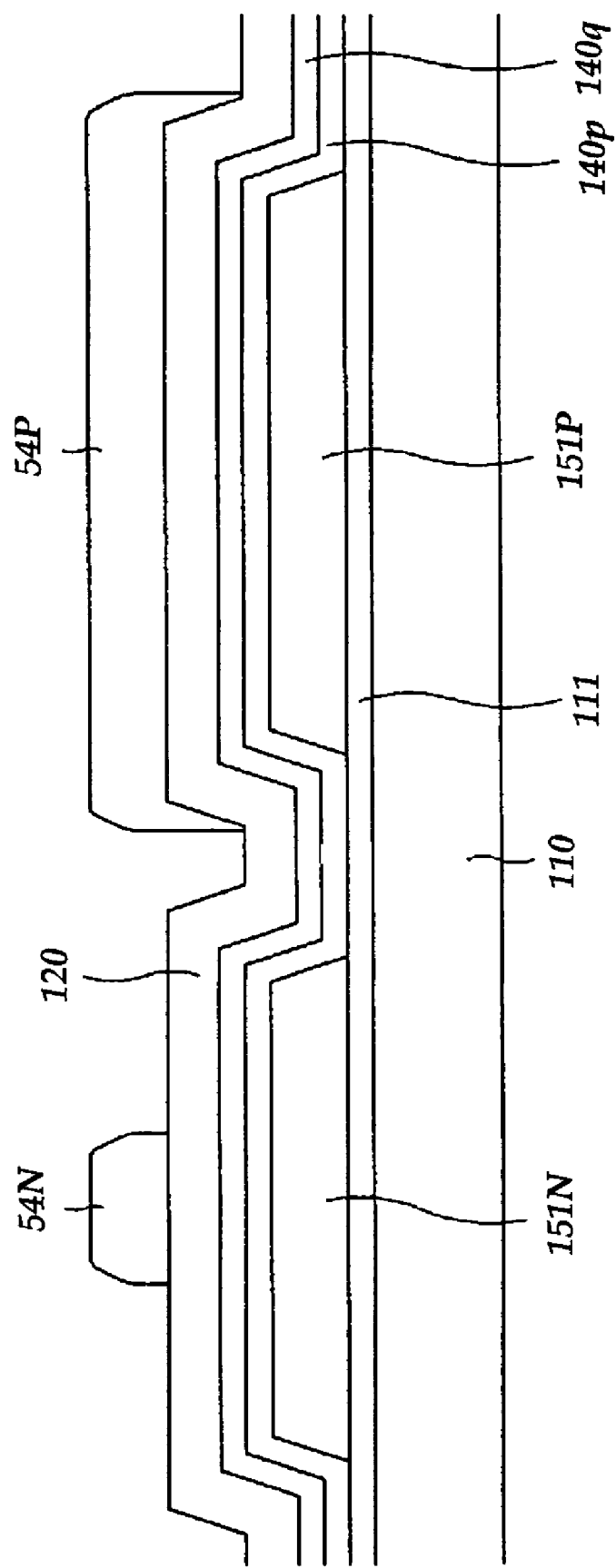
FIG. 10 is a sectional view of the CMOS transistor in the step shown in FIG. 9.
Figure 12:
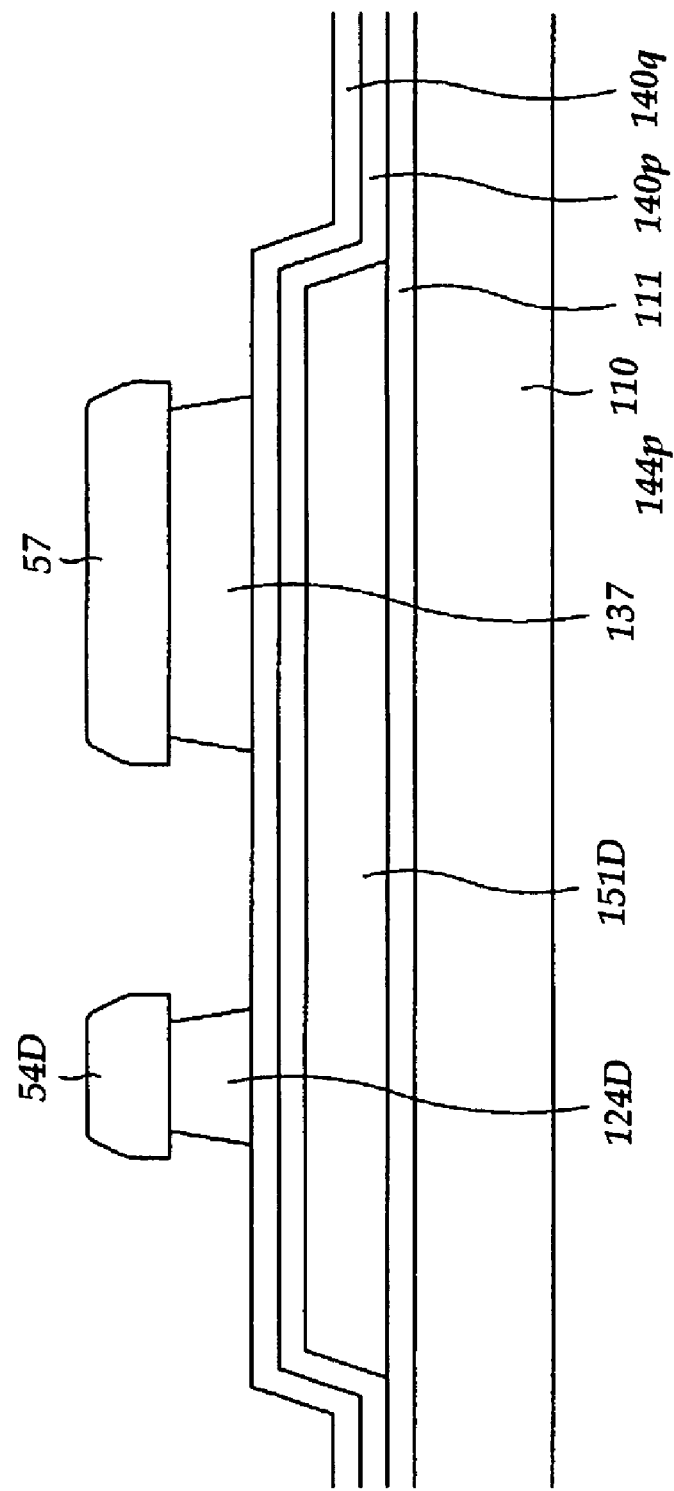
FIG. 12 is a sectional view of the TFT array panel shown in FIG. 11 taken along the line XII-XII'.
Figure 13:
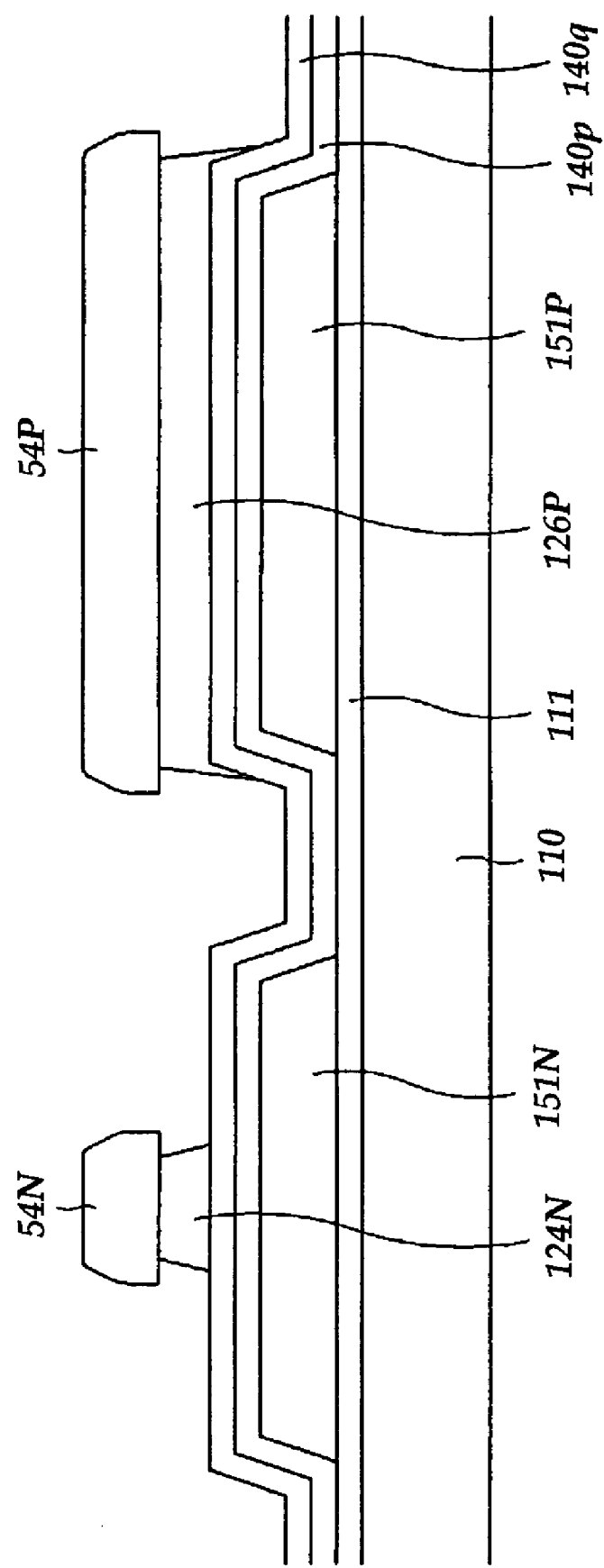
FIG. 13 is a sectional view of the CMOS transistor in the step shown in FIGS. 11 and 12.
Figure 15:
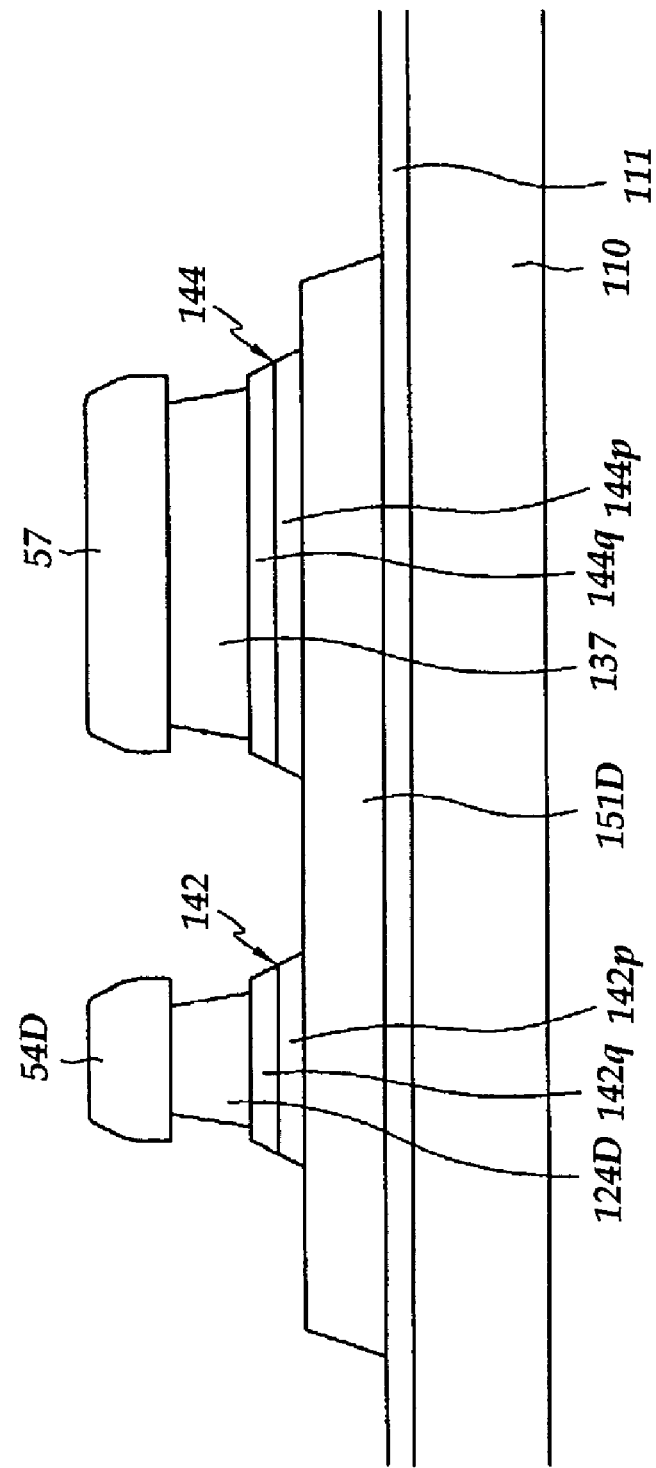
FIG. 15 is a sectional view of the TFT array panel shown in FIG. 14 taken along the line XV-XV'.
Figure 16:
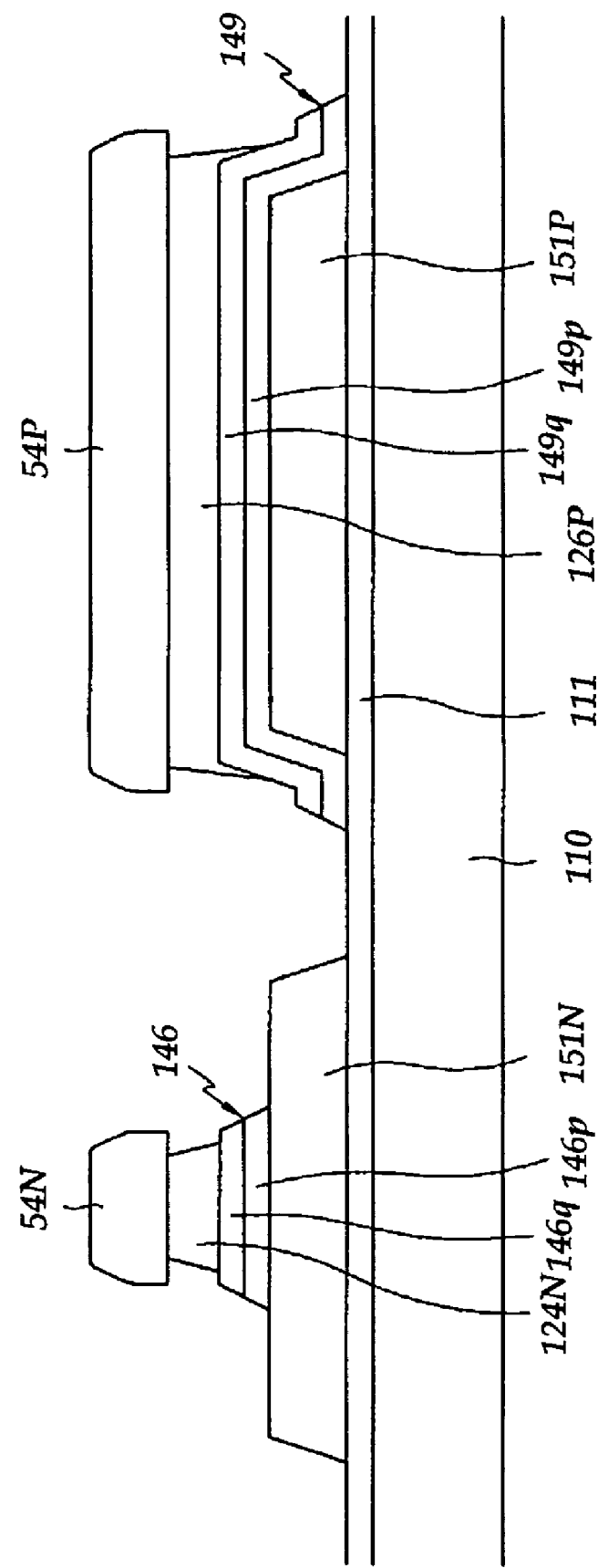
FIG. 16 is a sectional view of the CMOS transistor in the step shown in FIGS. 14 and 15.
Figure 17:
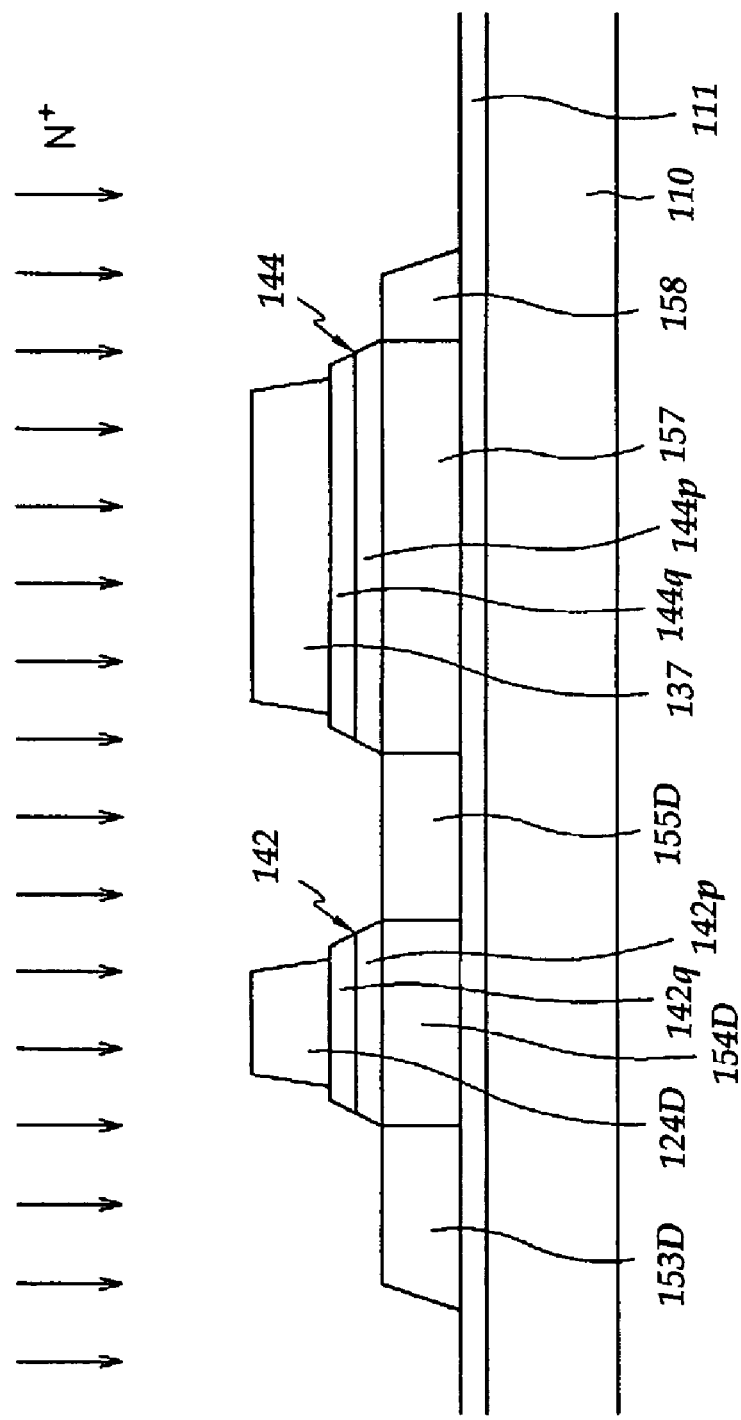
FIG. 17 is a sectional view of the TFT array panel shown in FIG. 14 taken along the line XV-XV', and illustrate the step following the step shown in FIGS. 14-16.
Figure 18:
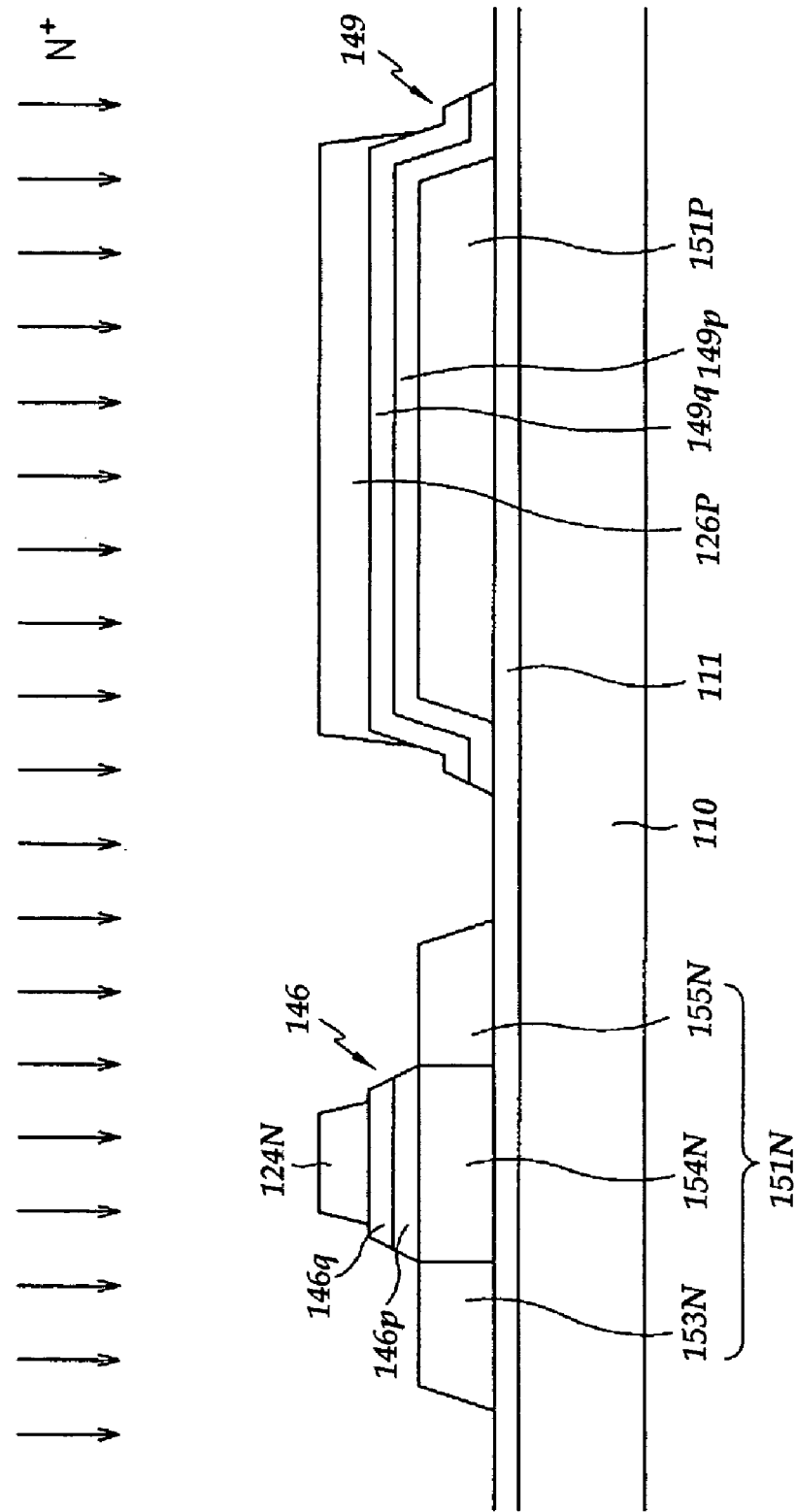
FIG. 18 is a sectional view of the CMOS transistor in the step shown in FIG. 17.
Figure 19:
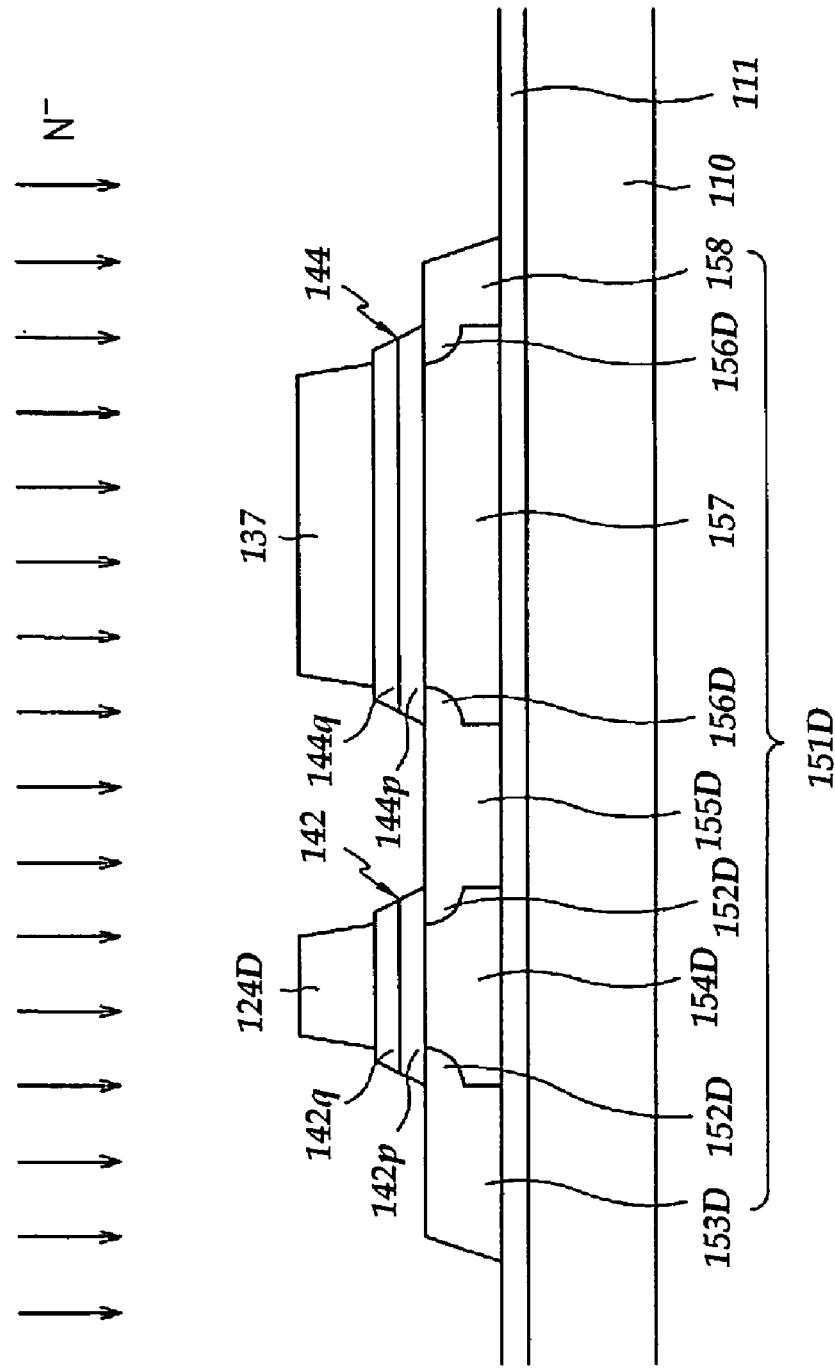
FIG. 19 is a sectional view of the TFT array panel shown in FIG. 14 taken along the line XV-XV', and illustrate the step following the step shown in FIGS. 17 and 18.
Figure 20:
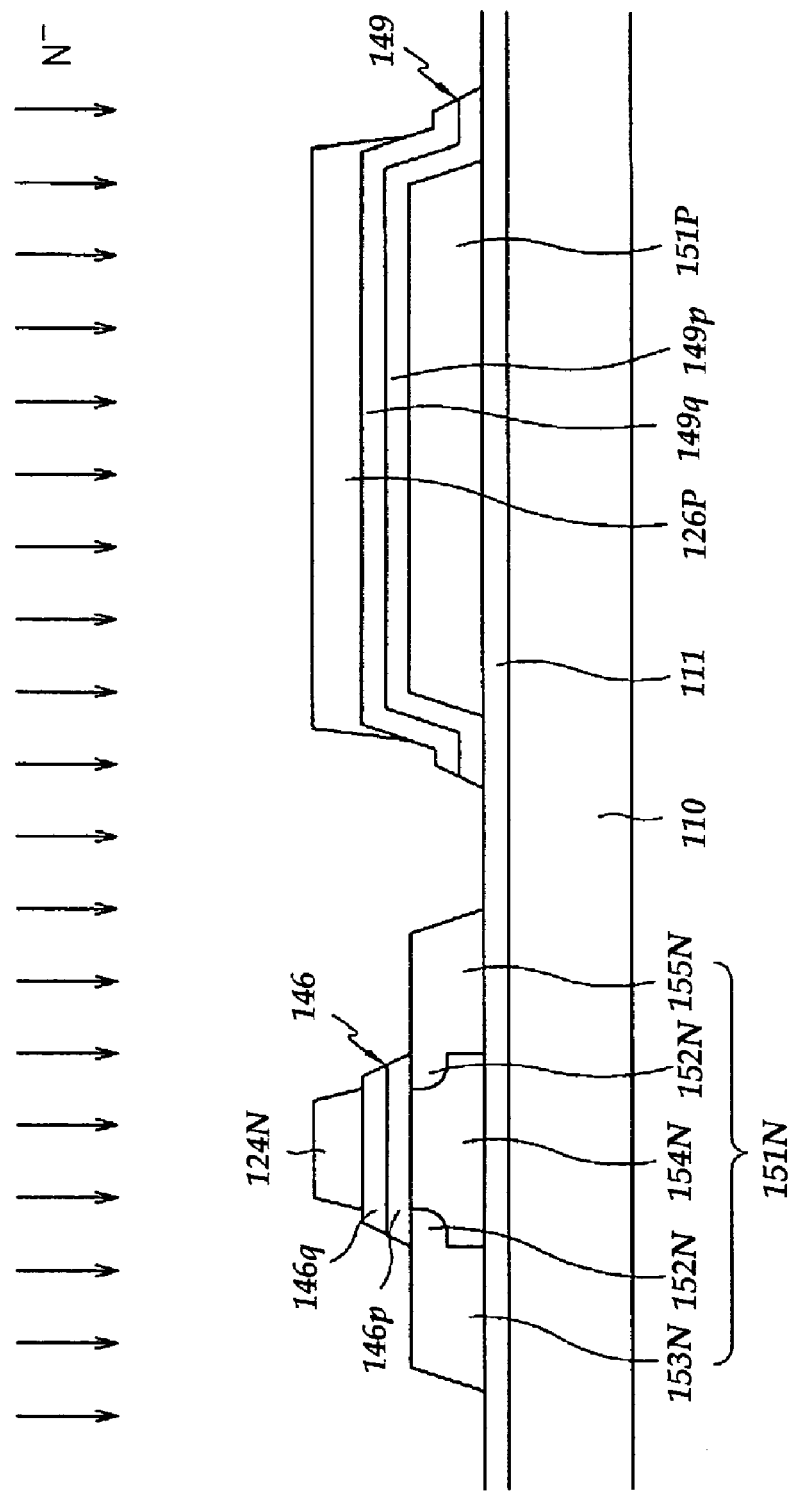
FIG. 20 is a sectional view of the CMOS transistor in the step shown in FIG. 19.
Figure 21:
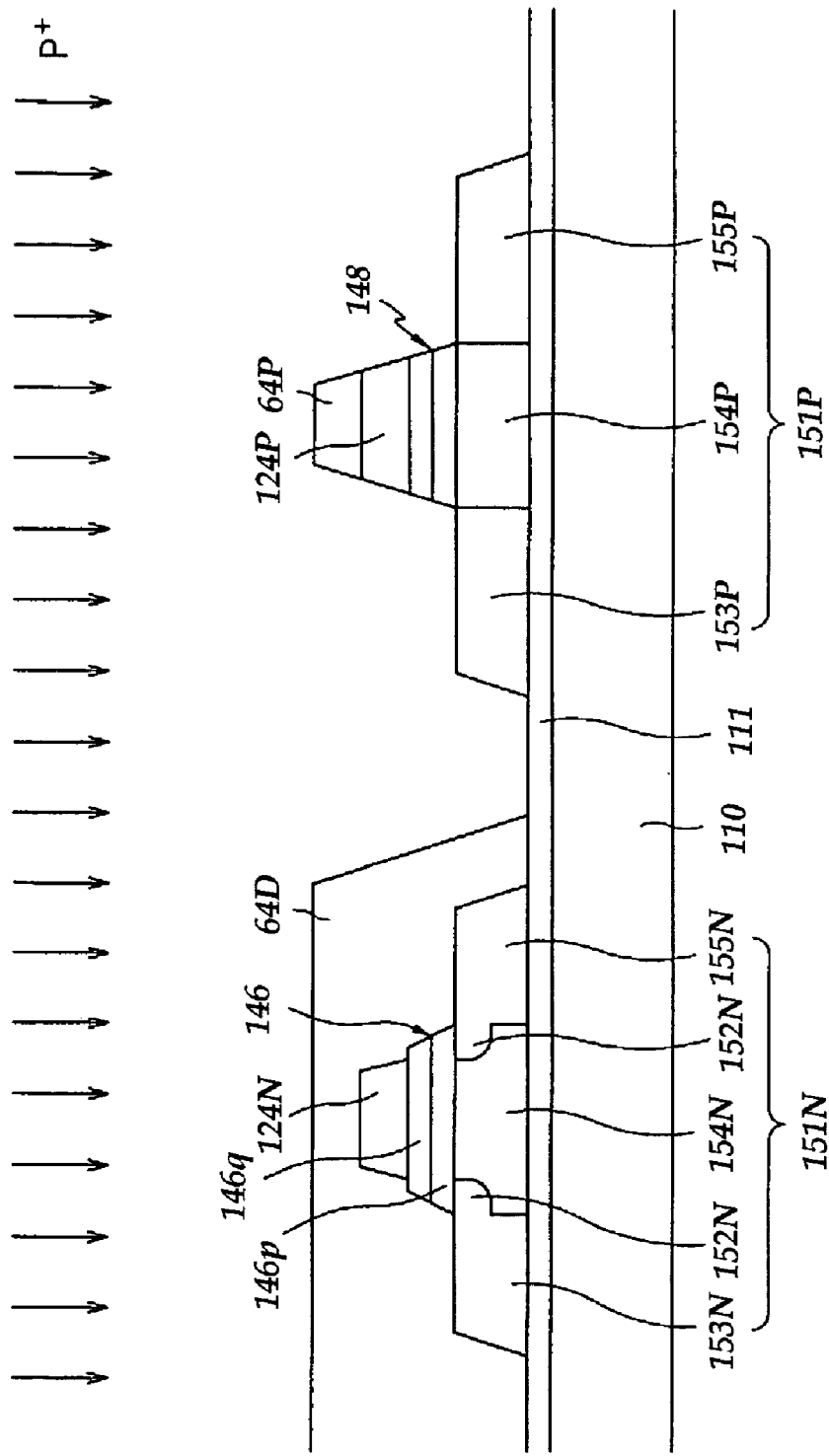
FIG. 21 is a sectional view of the CMOS transistor in the step shown in FIG. 20.
Figure 23:
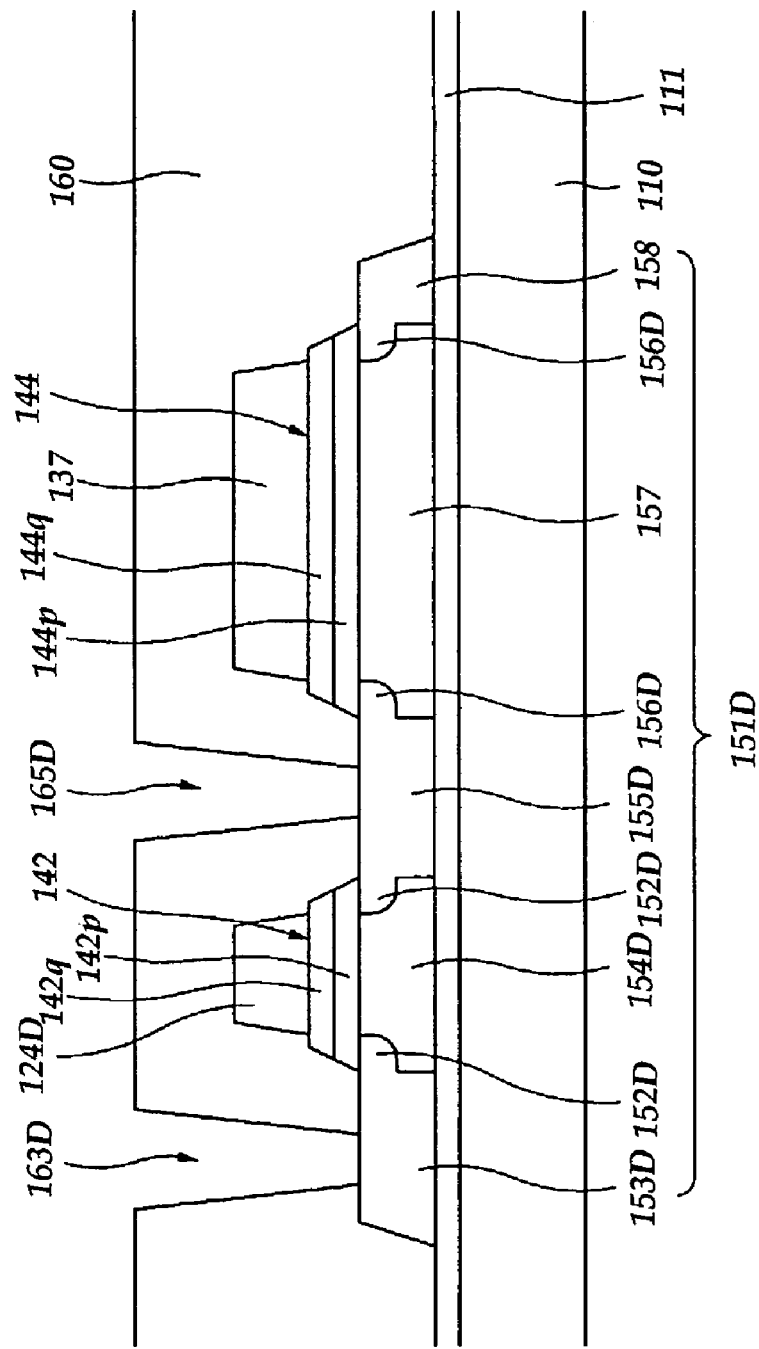
FIG. 23 is a sectional view of the TFT array panel shown in FIG. 22 taken along the line XXII-XXII'.
Figure 24:
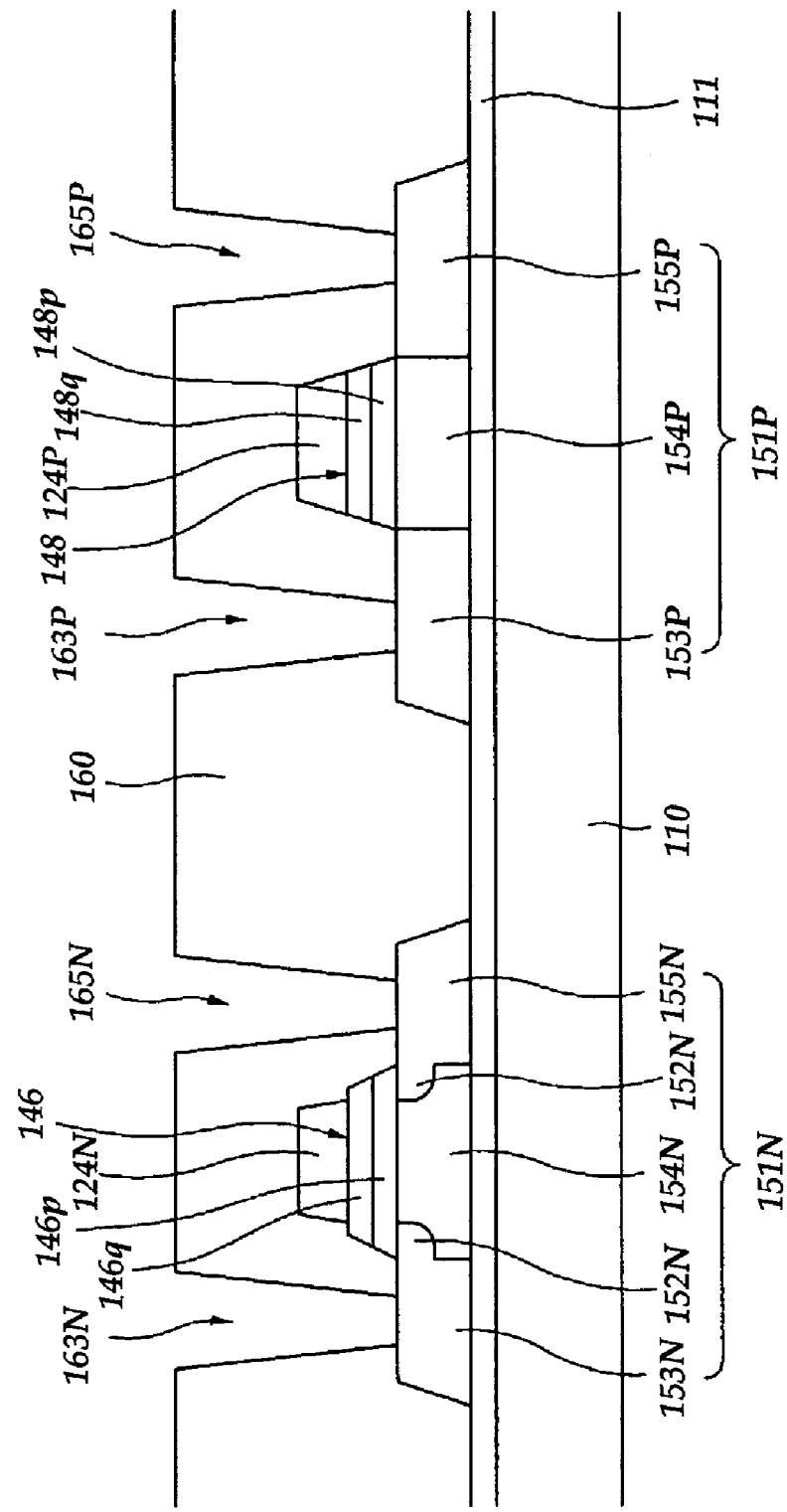
FIG. 24 is a sectional view of the CMOS transistor in the step shown in FIGS. 22 and 23.
Figure 25:
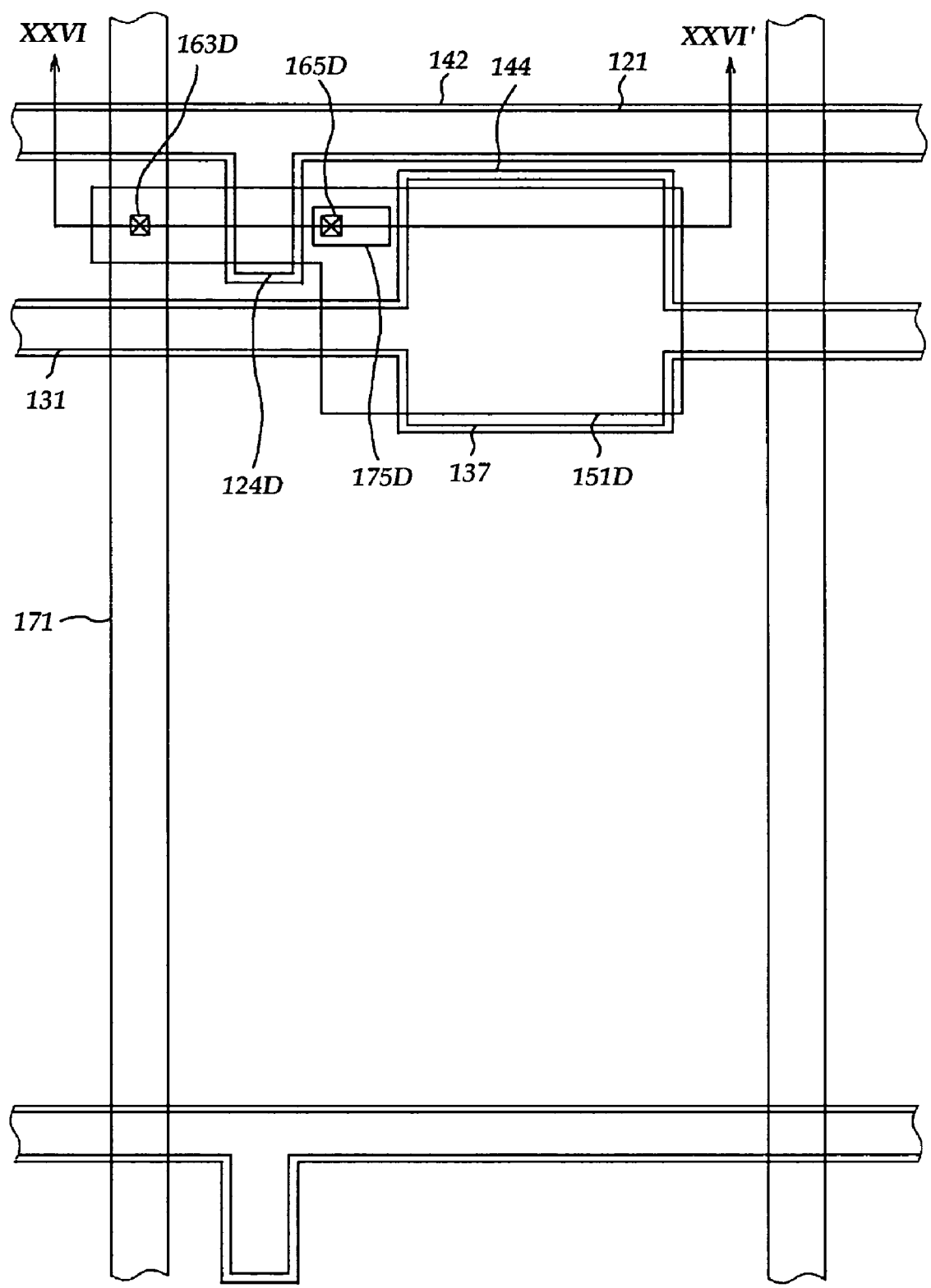
FIG. 25 is a layout view of the TFT array panel in the step following the step shown in FIGS. 22-24.
Figure 26:
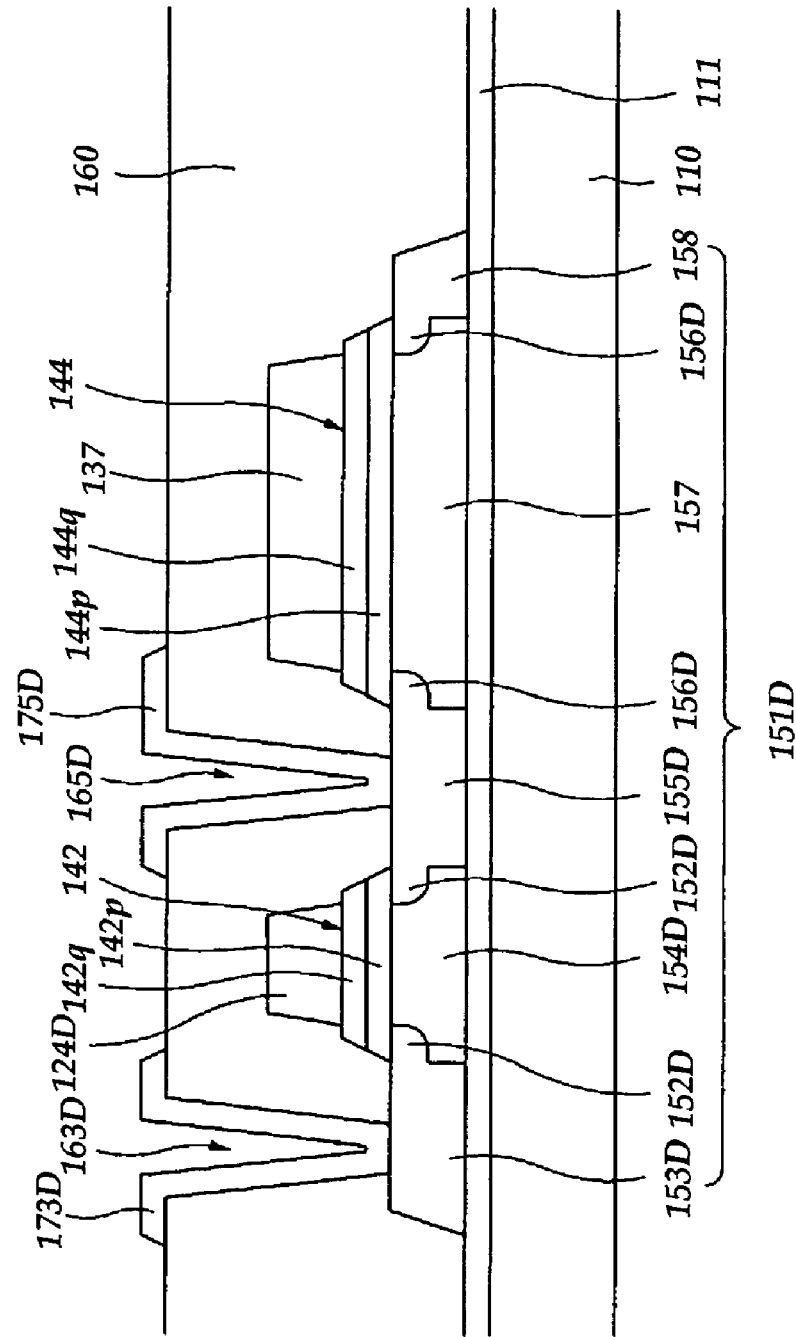
FIG. 26 is a sectional view of the TFT array panel shown in FIG. 25 taken along the line XXVI-XXVI'.
Figure 27:
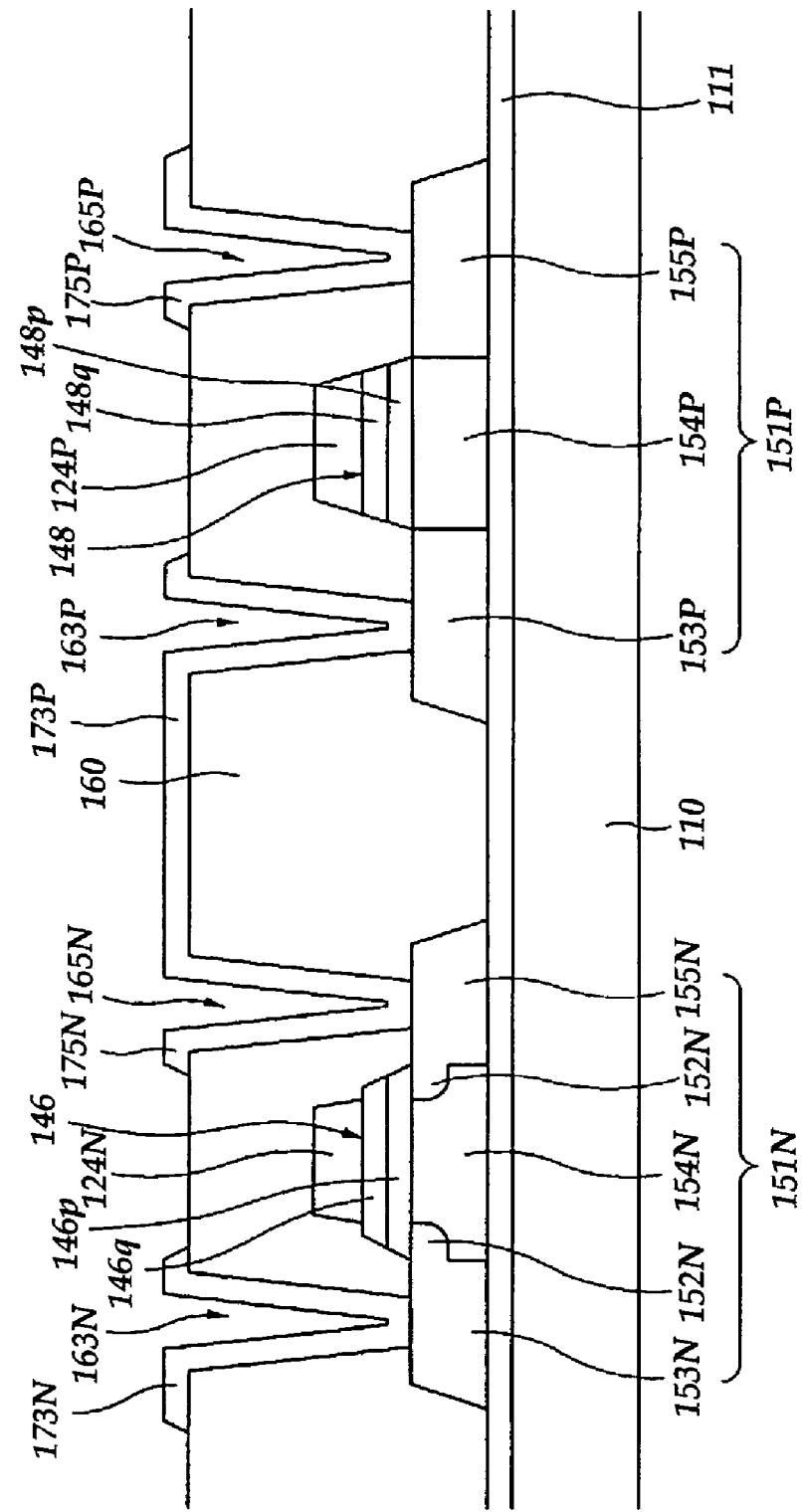
FIG. 27 is a sectional view of the CMOS transistor in the step shown in FIGS. 25 and 26.
Figure 28:
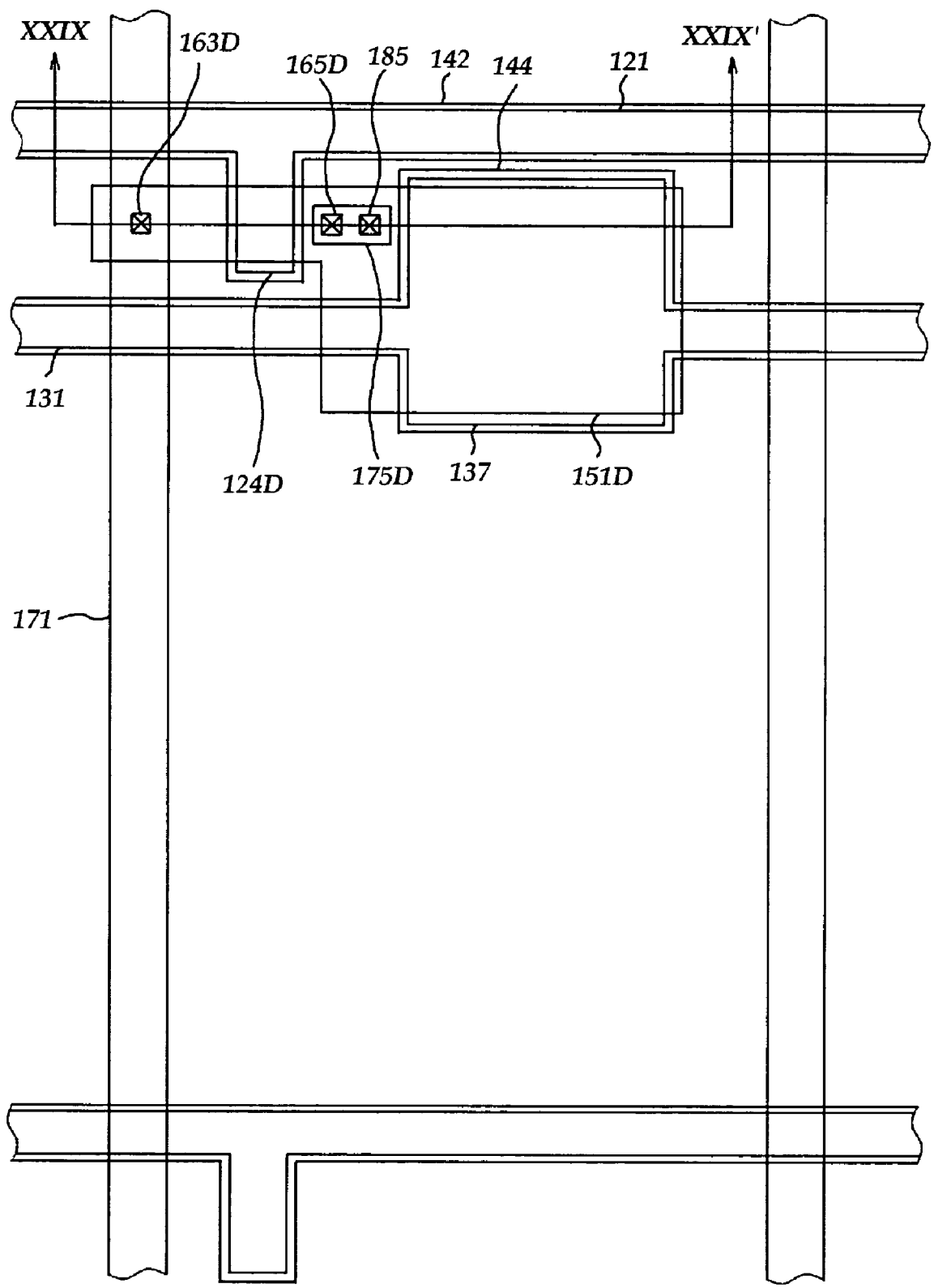
FIG. 28 is a layout view of the TFT array panel in the step following the step shown in FIGS. 25-27.
Figure 29:
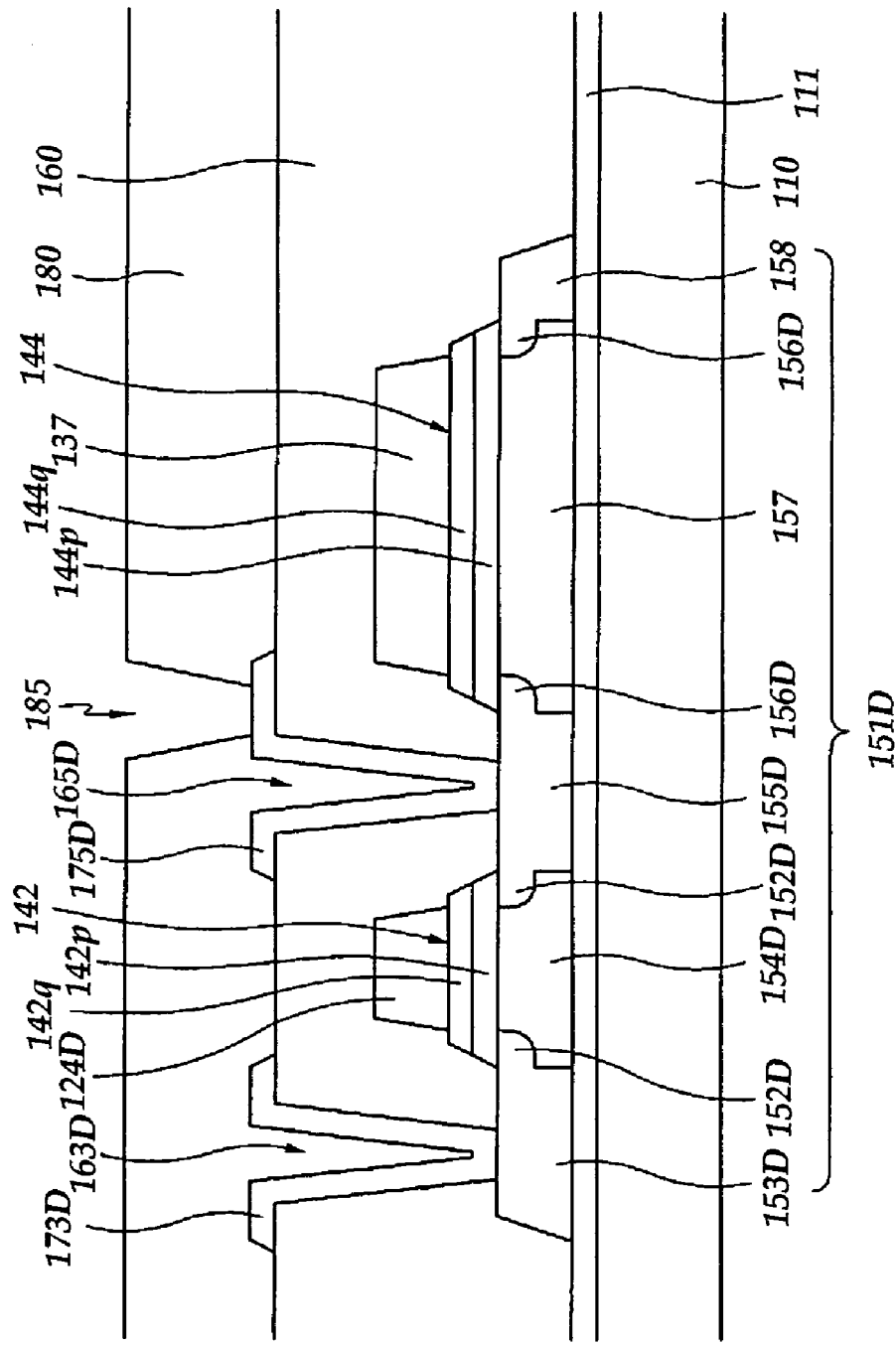
FIG. 29 is a sectional view of the TFT array panel shown in FIG. 28 taken along the line XXIX-XXIX'.
Figure 30:
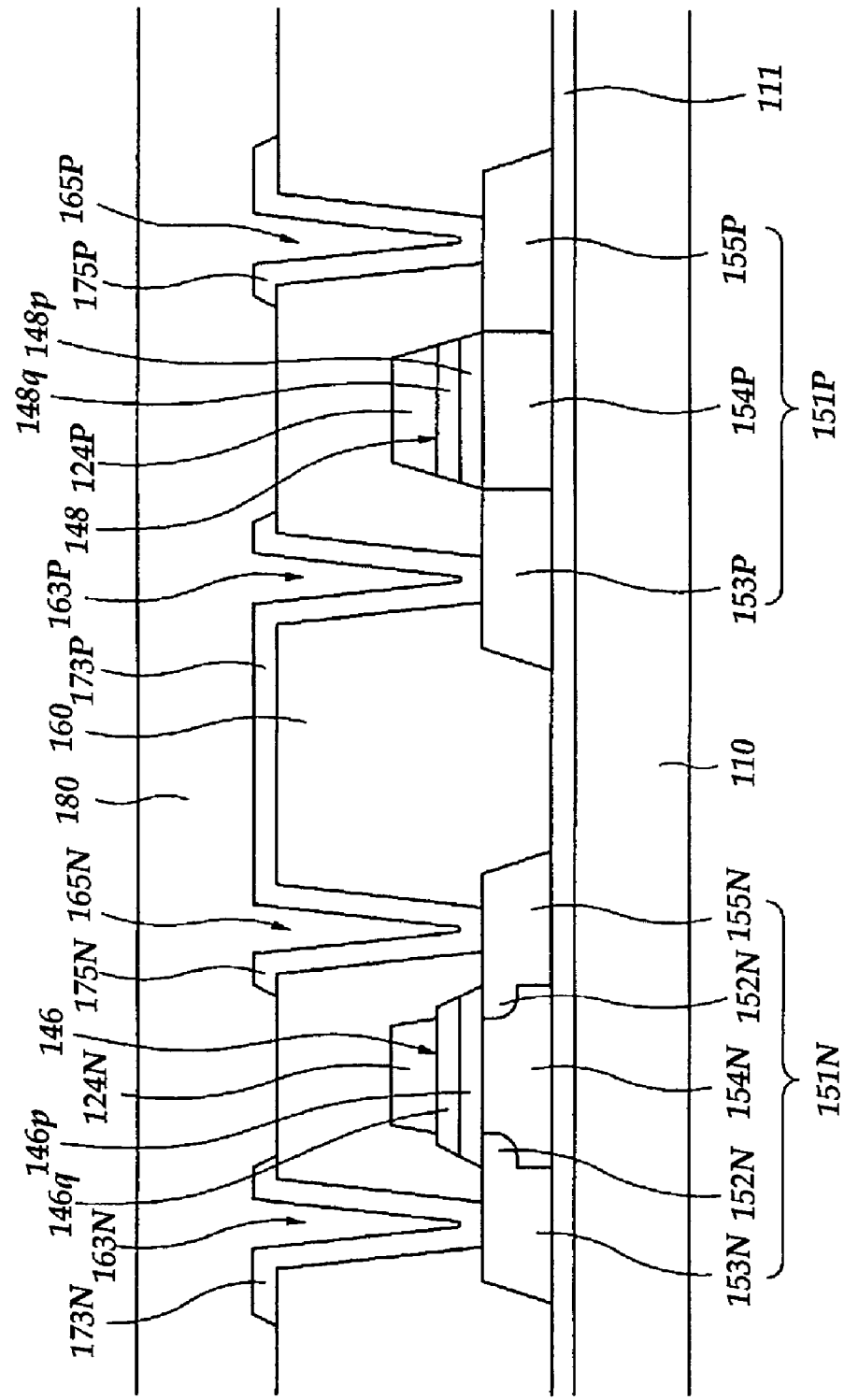
FIG. 30 is a sectional view of the CMOS transistor in the step shown in FIGS. 28 and 29.

FIG. 6 is a layout view of the TFT array panel shown in FIGS. 3 and 4 in the first step of a manufacturing method thereof according to an embodiment of the present invention; FIG. 7 is a sectional view of the TFT array panel shown in FIG. 6 taken along the line VII-VII'; FIG. 8 is a sectional view of the CMOS transistor shown in FIG. 5 in the step shown in FIGS. 6 and 7; FIG. 9 is a sectional view of the TFT array panel shown in FIG. 6 taken along the line VII-VII', and illustrate the step following the step shown in FIGS. 7 and 8; FIG. 10 is a sectional view of the CMOS transistor in the step shown in FIG. 9; FIG. 11 is a layout view of the TFT array panel in the step following the step shown in FIGS. 9 and 10; FIG. 12 is a sectional view of the TFT array panel shown in FIG. 11 taken along the line XII-XII'; FIG. 13 is a sectional view of the CMOS transistor in the step shown in FIGS. 11 and 12; FIG. 14 is a layout view of the TFT array panel in the step following the step shown in FIGS. 11-13; FIG. 15 is a sectional view of the TFT array panel shown in FIG. 14 taken along the line XV-XV'; FIG. 16 is a sectional view of the CMOS transistor in the step shown in FIGS. 14 and 15; FIG. 17 is a sectional view of the TFT array panel shown in FIG. 14 taken along the line XV-XV', and illustrate the step following the step shown in FIGS. 14-16; FIG. 18 is a sectional view of the CMOS transistor in the step shown in FIG. 17; FIG. 19 is a sectional view of the TFT array panel shown in FIG. 14 taken along the line XV-XV', and illustrate the step following the step shown in FIGS. 17 and 18; FIG. 20 is a sectional view of the CMOS transistor in the step shown in FIG. 19; FIG. 21 is a sectional view of the CMOS transistor in the step shown in FIG. 20; FIG. 22 is a layout view of the TFT array panel in the step following the step shown in FIG. 20; FIG. 23 is a sectional view of the TFT array panel shown in FIG. 22 taken along the line XXII-XXII'; FIG. 24 is a sectional view of the CMOS transistor in the step shown in FIGS. 22 and 23; FIG. 25 is a layout view of the TFT array panel in the step following the step shown in FIGS. 22-24; FIG. 26 is a sectional view of the TFT array panel shown in FIG. 25 taken along the line XXVI-XXVI'; FIG. 27 is a sectional view of the CMOS transistor in the step shown in FIGS. 25 and 26; FIG. 28 is a layout view of the TFT array panel in the step following the step shown in FIGS. 25-27; FIG. 29 is a sectional view of the TFT array panel shown in FIG. 28 taken along the line XXIX-XXIX'; and FIG. 30 is a sectional view of the CMOS transistor in the step shown in FIGS. 28 and 29.

Referring to FIGS. 6-8, a blocking film 11 is formed on an insulating substrate 110, and a semiconductor layer preferably made of amorphous silicon is deposited thereon. The semiconductor layer is then crystallized by laser annealing, furnace annealing, or solidification and patterned by lithography and etching to form a plurality of semiconductor islands 151D, 151N and 151P.

Referring to FIGS. 9 and 10, a lower insulating film 140p preferably made of silicon oxide and an upper insulating film 140q preferably made of silicon nitride are deposited in sequence and a gate conductor film 120 is deposited thereon. A photoresist including a plurality of portions 54D, 57, 54N and 54P are formed on the gate conductor film 120. The portions 54D and 57 are disposed on the semiconductor islands 151D, and the portions 54N and 54P are disposed on the semiconductor islands 151N and 151P, respectively.

Referring to FIGS. 11-13, the gate conductor film 120 is patterned by isotropic etch using the photoresist 54D, 57, 54N and 54P as an etch mask to form a plurality of gate conductors that include a plurality of gate lines 121 including gate electrodes 124D and a plurality of storage electrode lines 131 including storage electrodes 137 on the semiconductor islands 154D, a plurality of gate electrodes 124N for N type TFTs on the semiconductor islands 154N, and a plurality of electrode conductors 126P on the semiconductor islands 154P. The electrode conductors 126P fully cover the semiconductor islands 154P. The isotropic etch makes edges of the gate conductors 121, 131, 124N and 126P lie within edges of the photoresist 54D, 57, 54N and 54P.

Referring to FIGS. 14-16, the upper and the lower insulating films 140q and 140p are patterned by anisotropic etch using the photoresist 54D, 57, 54N and 54P as an etch mask to form a plurality of insulators 142, 144, 146 and 149 including lower insulators 142p, 144p, 146p and 149p and upper insulators 142q, 144q, 146q and 149q. The anisotropic etch makes edges of the insulators 142, 144, 146 and 149 lie out of edges of the gate conductors 121, 131, 124N and 126P.

Referring to FIGS. 17 and 18, the photoresist 54D, 57, 54N and 54P is removed and high-concentration N type impurity is introduced with a low energy of about 3-40 eV into the semiconductor islands 151D and 151N by PECVD or plasma emulsion such that regions of the semiconductor islands 151D, 151N and 151P disposed under the insulators 142, 144, 146 and 149 are not doped and remaining regions of the semiconductor islands 151D and 151N are heavily doped, thereby forming source and drain regions 153D, 153N, 155D and 155N and dummy regions 158 as well as channel regions 154D and 154N and storage regions 157. The low energy prevents the damage due to high voltage for generating high energy to stabilize the characteristics of TFTs.

Referring to FIGS. 19 and 20, low-concentration N type impurity is implanted with a high energy into the semiconductor islands 151D and 151N by using a scanning equipment or an ion beam equipment such that regions of the semiconductor islands 151D, 151N and 151P disposed under the gate conductors 121, 131, 124N and 126P are not doped and remaining regions of the semiconductor islands 151D and 151N are heavily doped to form lightly doped regions 152D, 156D and 152N at upper side portion of the channel regions 154D and 154N and the storage regions 157.

Referring to FIG. 21, a photoresist including a plurality of portions 64D and 64P are formed. The portions 64D fully cover the semiconductor islands 151D and 151N, and the portions 64P are disposed on the electrode conductors 126P opposite the semiconductor islands 154P. The electrode conductors 126P are patterned using the photoresist 64D and 64P to form a plurality of gate electrodes 124P and the upper and lower insulators 149q and 149p are patterned to form a plurality of gate insulators 148 including upper and lower insulators 148q and 148p and to expose portions of the semiconductor islands 151P. Thereafter, high-concentration P type impurity is implanted with a low energy of about 3-40 eV into the semiconductor islands 151P by PECVD or plasma emulsion such that regions of the semiconductor islands 151P disposed under the insulators 148 and the gate electrodes 124P are not doped and remaining regions of the semiconductor islands 151P are heavily doped to form source and drain regions 153P and 155P as well as channel regions 154P.

Referring to FIGS. 22-24, an interlayer insulating layer 160 is deposited and patterned to form a plurality of contact holes 163P, 163N, 163P, 165D, 165N and 165P exposing the source regions 153D, 153N and 153P and the drain regions 155D, 155N and 155P.

Referring to FIGS. 25-27, a plurality of data conductors including a plurality of data lines 171 including source electrodes 173D for pixels, a plurality of drain electrodes 175D for pixels, a plurality of source and drain electrodes 173N and 175N for N type TFTs, and a plurality of source and drain electrodes 173P and 175P for P type TFTs are formed on the interlayer insulating layer 160.

Referring to FIGS. 28-30, a passivation layer 180 is deposited and patterned to form a plurality of contact holes 185 exposing the drain regions 155D for pixels.

Referring to FIGS. 3-5, a plurality of pixel electrodes 190 are formed on the passivation layer 180.

As described above, the heavily doped regions 153D, 153N, 155D, 155N and 158 and the lightly doped regions 152D, 156D and 152N are formed by using a single lithography step, thereby simplifying the manufacturing method to reduce the manufacturing cost.

Now, a TFT array panel for an LCD according to another embodiment of the present invention will be described in detail with reference to FIGS. 31-33.

Figure 31:
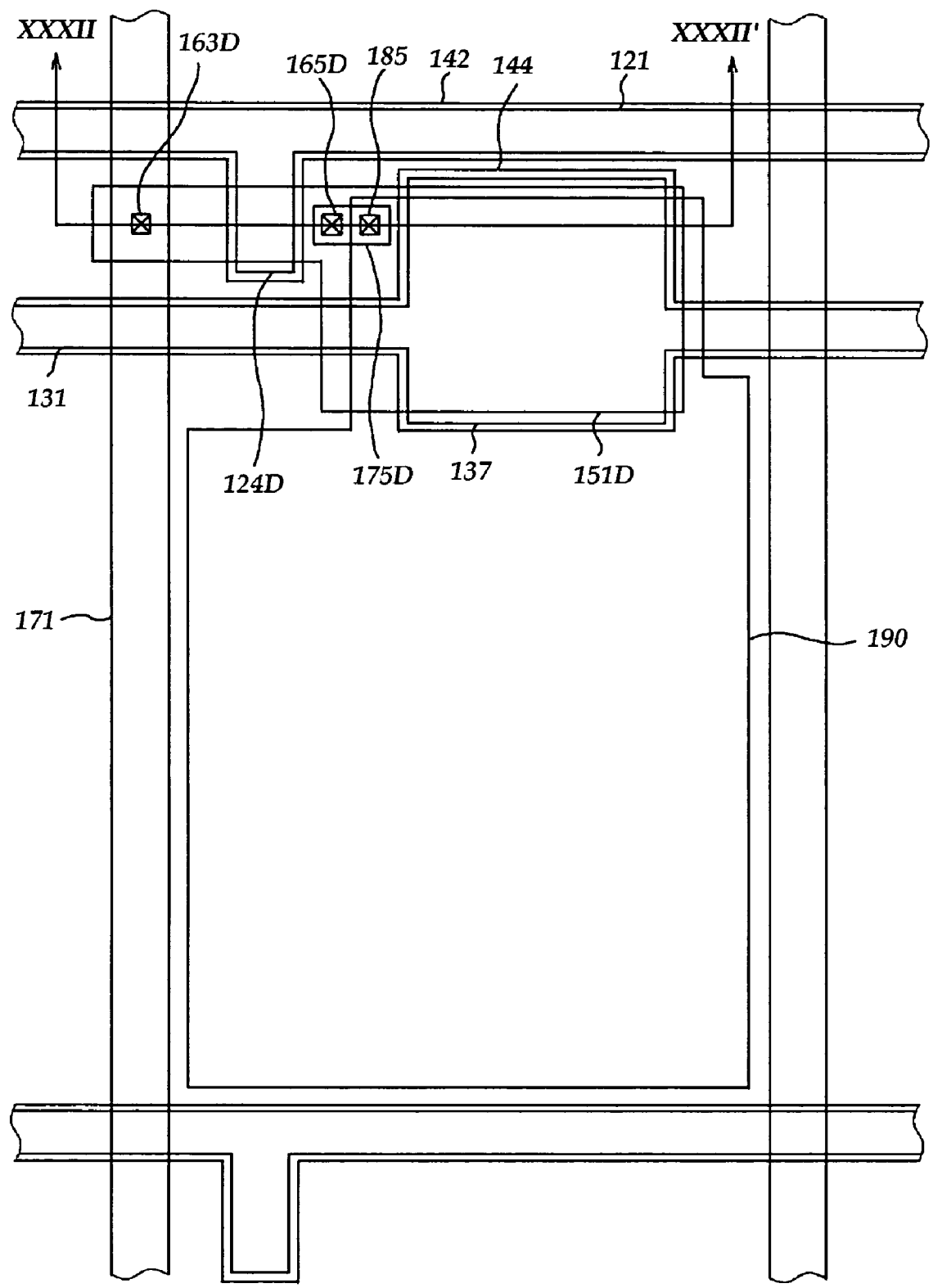
FIG. 31 is a layout view of a display area of the TFT array panel shown in FIGS. 1 and 2 according to another embodiment of the present invention.
Figure 32:
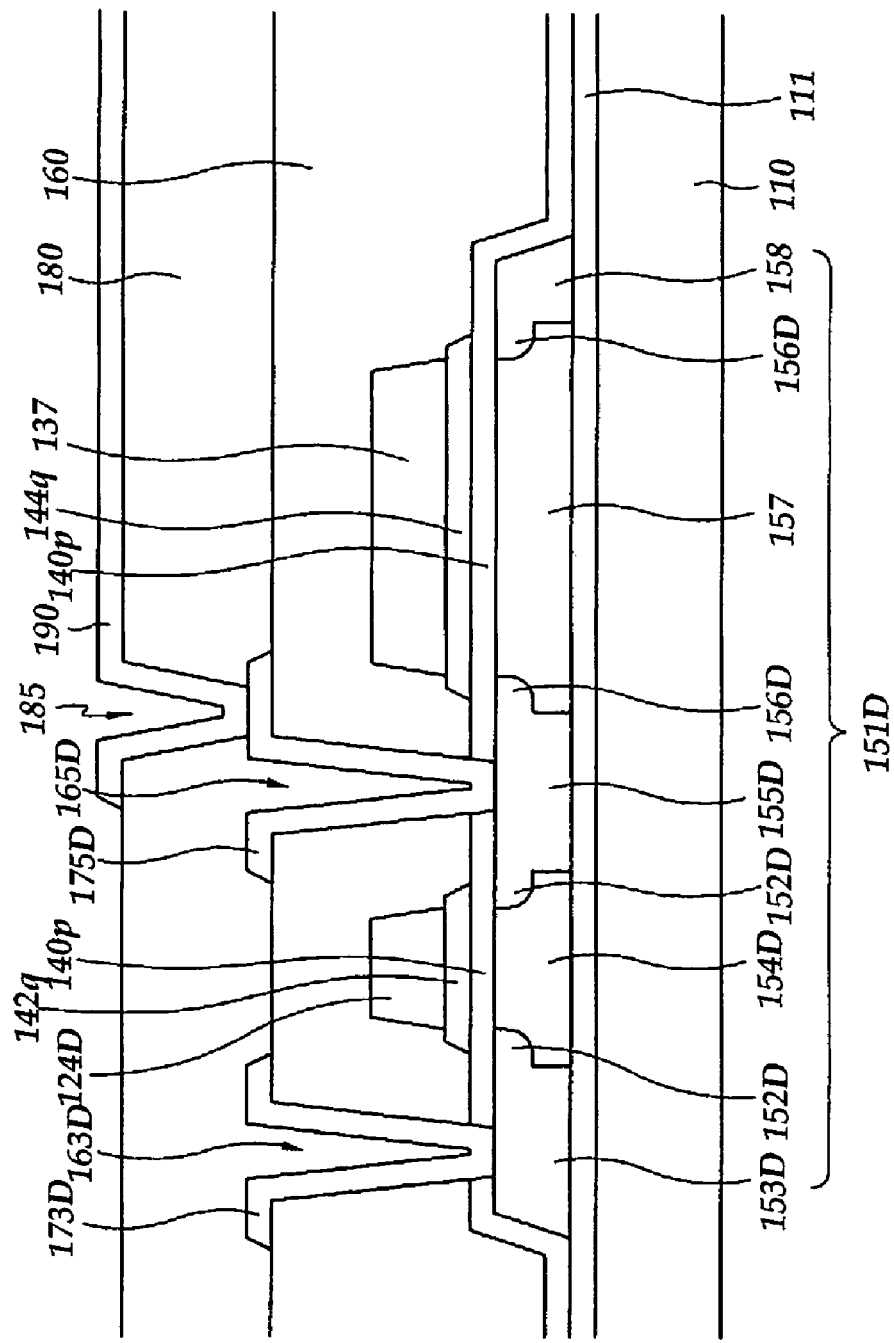
FIG. 32 is a sectional view of the display area shown in FIG. 31 taken along the lines XXXII-XXXII'.
Figure 33:
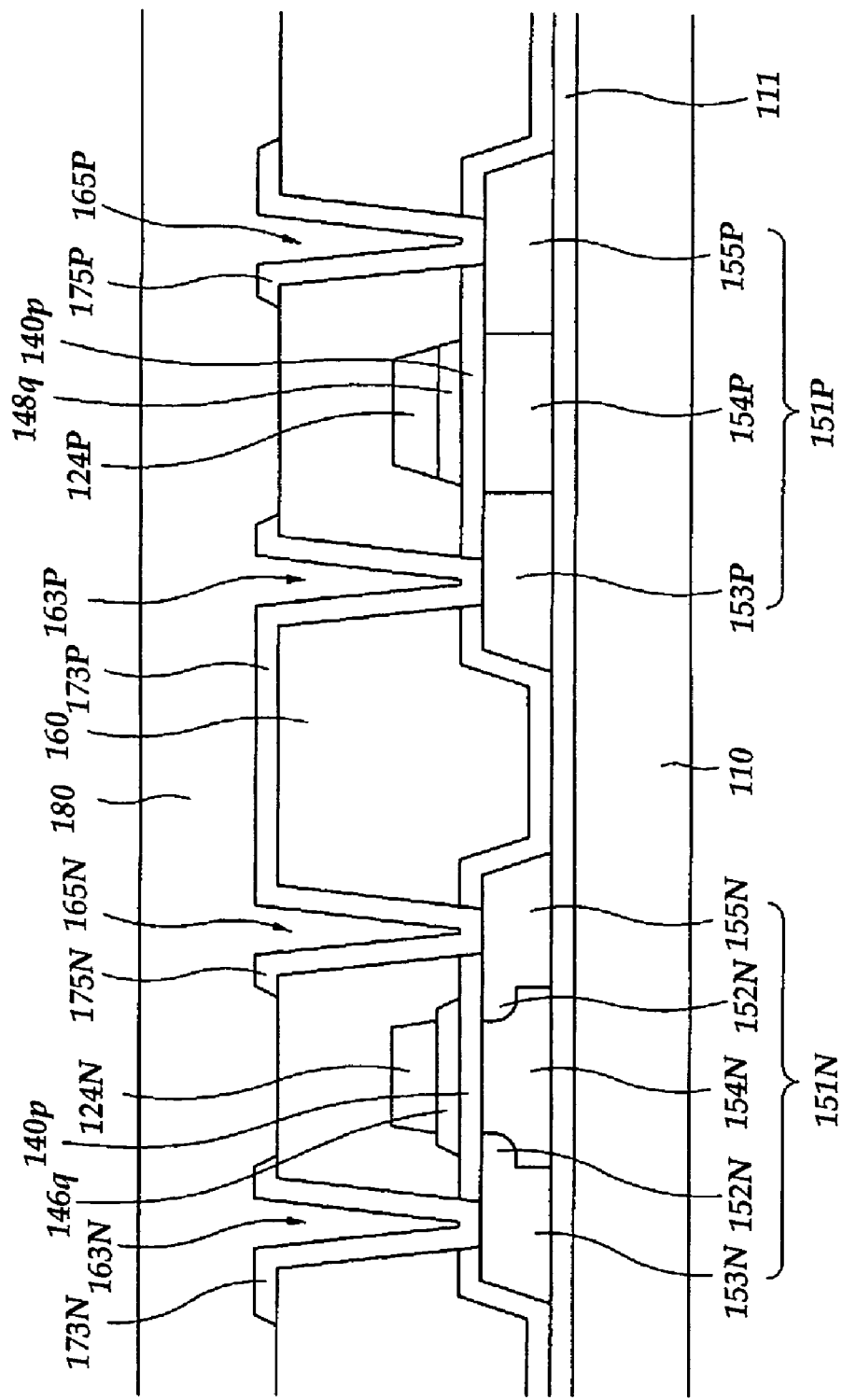
FIG. 33 is a sectional view of a CMOS transistor of the driver shown in FIGS. 1 and 2.

FIG. 31 is a layout view of a display area of the TFT array panel shown in FIGS. 1 and 2 according to another embodiment of the present invention, FIG. 32 is a sectional view of the display area shown in FIG. 31 taken along the lines XXXII-XXXII', and FIG. 33 is a sectional view of a CMOS transistor of the driver shown in FIGS. 1 and 2.

Referring to FIGS. 31-33, a layered structure of the TFT array panel according to this embodiment is almost the same as those shown in FIGS. 3-5.

That is, a blocking film 111 is formed on a substrate 110, and a plurality of semiconductor islands 151D, 151N and 151P are formed thereon. The semiconductor islands 151D, 151N and 151P include channel regions 154D, 154N and 154P, storage regions 157, source and drain regions 153D, 155D, 153N, 155N, 153P and 155P, dummy regions 158, and lightly doped regions 152D, 156D and 152N. A lower gate insulator 140$p$ and a plurality of upper gate insulators 142$q$, 144$q$, 146$q$ and 148$q$ are formed on the semiconductor islands 151D, 151N and 151P and a plurality of gate conductors including a plurality of gate lines 121, a plurality of storage electrode lines 131, and a plurality of gate electrodes 124N and 124P are formed thereon. An interlayer insulating layer 160 is formed on the gate conductors 121, 131, 124N and 124P and a plurality of data conductors including a plurality of data lines 171 and a plurality of source and drain electrodes 173N, 173P, 175D, 175N and 175P are formed on the interlayer insulating layer 160. A passivation layer 180 is formed on the data conductors 171, 175D, 173N, 175N, 173P and 175P and the interlayer insulating layer 160 and a plurality of pixel electrodes 190 are formed on the passivation layer 180. The interlayer insulating layer 160 has a plurality of contact holes 163D, 163N, 163P, 165D, 165N and 165P and the passivation layer 180 has a plurality of contact holes 185.

Different from the TFT array panel shown in FIGS. 3-5, the lower gate insulator 140$p$ does not have the same planar shape as the upper gate insulators 142$q$, 144$q$, 146$q$ and 148$q$, but it has substantially the same planar shape as the interlayer insulating layer 160. That is, the lower gate insulator 140$p$ covers an entire surface of the substrate 110 and shares the contact holes 163D, 163N, 163P, 165D, 165N and 165P with the interlayer insulating layer 160.

Many of the above-described features of the TFT array panel for an LCD shown in FIGS. 3-30 may be appropriate to the TFT array panel shown in FIGS. 31-33.

Finally, the operation of the above-described LCD will be described in detail.

The signal controller 600 is supplied with input image signals R, G and B and input control signals controlling the display thereof such as a vertical synchronization signal Vsync, a horizontal synchronization signal Hsync, a main clock MCLK, and a data enable signal DE, from an external graphics controller (not shown). After generating gate control signals CONT1 and data control signals CONT2 and processing the image signals R, G and B suitable for the operation of the panel assembly 300 on the basis of the input control signals and the input image signals R, G and B, the signal controller 600 transmits the gate control signals CONT1 to the gate driver 400, and the processed image signals R', G' and B' and the data control signals CONT2 to the data driver 500, through the signal lines 521-523 and the driving signal lines 321 and 323.

The gate control signals CONT1 include a scanning start signal STV for instructing to start scanning and at least a clock signal for controlling the output time of the gate-on voltage Von. The gate control signals CONT1 may further include an output enable signal OE for defining the duration of the gate-on voltage Von.

The data control signals CONT2 include a horizontal synchronization start signal STH for informing of start of a horizontal period, a load signal LOAD for instructing to apply the data voltages to the data lines $D_1$-$D_m$, a inversion control signal RVS for reversing the polarity of the data voltages (with respect to the common voltage Vcom), and a data clock signal HCLK.

The data driver 500 receives a packet of the image data R', G' and B' for a pixel row from the signal controller 600 and converts the image data R', G' and B' into analog data voltages selected from the gray voltages supplied from the gray voltage generator 800 in response to the data control signals CONT2 from the signal controller 600. Thereafter, the data driver 500 applies the data voltages to the data lines D1-Dm.

Responsive to the gate control signals CONT1 from the signal controller 600, the gate driver 400 applies the gate-on voltage Von to the gate line $G_1$-$G_n$, thereby turning on the switching elements Q connected thereto. The data voltages applied to the data lines D1-Dm are supplied to the pixels through the activated switching elements Q.

The difference between the data voltage and the common voltage Vcom is represented as a voltage across the LC capacitor $C_{LC}$, i.e., a pixel voltage. The LC molecules in the LC capacitor $C_{LC}$ have orientations depending on the magnitude of the pixel voltage, and the molecular orientations determine the polarization of light passing through the LC layer 3. The polarizer(s) converts the light polarization into the light transmittance.

By repeating this procedure by a unit of the horizontal period (which is indicated by 1H and equal to one period of the horizontal synchronization signal Hsync and the data enable signal DE), all gate lines $G_1$-$G_n$ are sequentially supplied with the gate-on voltage Von during a frame, thereby applying the data voltages to all pixels. When the next frame starts after finishing one frame, the inversion control signal RVS applied to the data driver 500 is controlled such that the polarity of the data voltages is reversed (which is called "frame inversion"). The inversion control signal RVS may be also controlled such that the polarity of the data voltages flowing in a data line in one frame are reversed (for example, line inversion and dot inversion), or the polarity of the data voltages in one packet are reversed (for example, column inversion and dot inversion).

The above descriptions may be adapted to other flat panel display devices such as OLED.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A thin film transistor array panel comprising:
   an insulating substrate;
   a first polysilicon member that is formed on the substrate and includes an intrinsic region with intrinsic material formed thereon, at least one first extrinsic region with extrinsic material formed thereon, and at least one second extrinsic region with extrinsic material formed thereon disposed between the intrinsic region and the at least one first extrinsic region and having an impurity concentration lower than the at least one first extrinsic region;
   a first insulator formed on the first polysilicon member;
   a first electrode formed on the first insulator; and
   a second insulator disposed between the first polysilicon member and the first insulator, wherein the second extrinsic region includes an impurity introduced therein at an energy higher than an energy used to introduce the impurity into the first extrinsic region.

2. The thin film transistor array panel of claim 1, wherein the first and the second insulators have coinciding edges.

3. The thin film transistor array panel of claim 1, further comprising:
   a second polysilicon member that is formed on the substrate and includes an intrinsic region and at least one extrinsic region adjacent to the intrinsic region;
   a third insulator formed on the second polysilicon member; and
   a second electrode formed on a fourth insulator and having edges substantially coinciding with edges of the third insulator.

4. The thin film transistor array panel of claim 3, wherein the at least one extrinsic region of the second polysilicon member comprises impurity having a conductivity opposite to a conductivity of impurity included in the at least one first extrinsic region of the first polysilicon member.

5. The thin film transistor array panel of claim 1, wherein the at least one first extrinsic region comprises a pair of source and drain regions disposed opposite each other with respect to the intrinsic region and the at least one second extrinsic region comprises a pair of lightly doped regions disposed opposite each other with respect to the intrinsic region.

6. The thin film transistor array panel of claim 5, wherein the first polysilicon member further comprises a storage region disposed adjacent to the drain region opposite the intrinsic region.

7. The thin film transistor array panel of claim 6, further comprising: a data line connected to the source region; and a pixel electrode connected to the drain region.

8. The thin film transistor array panel of claim 1, wherein the at least one second extrinsic region has a thickness smaller than the at least one first extrinsic region and the direction of the thickness is perpendicular to a planar direction of the insulating substrate.

9. A method of manufacturing a thin film transistor array panel comprising:
   forming a polysilicon member on an insulating substrate;
   depositing a first gate insulating film;
   depositing a conductive film;
   forming a photoresist;
   patterning the conductive film by isotropic etching using the photoresist as an etch mask to form a gate electrode;
   patterning the first gate insulating film by anisotropic etching using the photoresist as an etch mask to form a first gate insulator;
   removing the photoresist;
   forming source and drain regions having a first impurity concentration by introducing impurity into the polysilicon member using the first gate insulator as a mask after removing the photoresist; and
   forming lightly doped regions having a second impurity concentration lower than the first impurity concentration by introducing impurity into the polysilicon member using the gate electrode as a mask after removing the photoresist, wherein the conductive film is patterned to form the gate electrode and the first gate insulating film is patterned to form the first gate insulator such that an edge of the formed gate electrode is narrower than the first gate insulator, the thickness of the lightly doped regions is thinner than the thickness of the source and drain regions, and the direction of thicknesses is perpendicular to the insulating substrate, and
   wherein the introduction of the impurity for the formation of lightly doped regions is performed using energy higher than the introduction of the impurity for the formation of source and drain regions.

10. The method of claim 9, wherein the introduction of the impurity for the formation of source and drain regions is performed by plasma enhanced chemical vapor deposition or plasma emulsion.

11. The method of claim 10, wherein the introduction of the impurity for the formation of source and drain regions is performed using energy of about 3-40 EV.

12. The method of claim 10, wherein the introduction of the impurity for the formation of lightly doped regions is performed by using a scanning equipment or an ion beam equipment.

13. The method of claim 9, further comprising:
    patterning the conductive film by isotropic etching using the photoresist as an etch mask to form a storage electrode; and
    patterning the first gate insulating film by anisotropic etching using the photoresist as an etch mask to form a second gate insulator under the storage electrode.

14. The method of claim 9, wherein the introduction of the impurity for the formation of the lightly doped regions is performed using an energy greater than the energy used in the introduction of the impurity for the formation of the source and drain regions.

15. The thin film transistor array panel of claim 1, wherein the at least one second extrinsic region has a thickness smaller than that of the at least one first extrinsic region and the direction of thickness is perpendicular to a planar direction of the insulating substrate.

16. The thin film transistor array panel of claim 1, wherein the second insulator has an edge substantially coinciding with a boundary between the extrinsic material of the at least one first extrinsic region and the extrinsic material of the at least one second extrinsic region and the first electrode has an edge substantially coinciding with a boundary between the intrinsic material of the intrinsic region and the extrinsic material of the at least one second extrinsic region.

17. The thin film transistor array panel of claim 1, wherein the second insulator is wider than the first insulator.

18. A thin film transistor array panel comprising:
    an insulating substrate;
    a first polysilicon member that is formed on the substrate and includes an intrinsic region with intrinsic material formed thereon, at least one first extrinsic region with extrinsic material formed thereon, and at least one second extrinsic region with extrinsic material formed thereon disposed between the intrinsic region and the at least one first extrinsic region and having an impurity concentration lower than the at least one first extrinsic region;
    a first insulator formed on the first polysilicon member;
    a first electrode formed on the first insulator; and
    a second insulator disposed between the first polysilicon member and the first insulator, wherein the second extrinsic region includes an impurity introduced therein at an energy higher than an energy used to introduce the impurity into the first extrinsic region.

19. The thin film transistor array panel of claim 1, wherein a boundary of the second insulator substantially coincides with a boundary of the first extrinsic region.

20. The thin film transistor array panel of claim 18, wherein a boundary in the horizontal direction of the second insulator is substantially vertically aligned with a boundary where the second extrinsic region meets the intrinsic region.

* * * * *